(12) United States Patent
Flemming et al.

(10) Patent No.: US 11,594,457 B2
(45) Date of Patent: *Feb. 28, 2023

(54) HETEROGENOUS INTEGRATION FOR RF, MICROWAVE AND MM WAVE SYSTEMS IN PHOTOACTIVE GLASS SUBSTRATES

(71) Applicant: 3D Glass Solutions, Inc., Albuquerque, NM (US)

(72) Inventors: Jeb H. Flemming, Albuquerque, NM (US); Kyle McWethy, Albuquerque, NM (US)

(73) Assignee: 3D Glass Solutions, Inc., Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/263,805

(22) PCT Filed: Dec. 26, 2019

(86) PCT No.: PCT/US2019/068586
§ 371 (c)(1),
(2) Date: Jan. 27, 2021

(87) PCT Pub. No.: WO2020/139951
PCT Pub. Date: Jul. 2, 2020

(65) Prior Publication Data
US 2021/0175136 A1 Jun. 10, 2021

Related U.S. Application Data

(60) Provisional application No. 62/786,155, filed on Dec. 28, 2018.

(51) Int. Cl.
*H01L 23/051* (2006.01)
*H01L 21/48* (2006.01)
(Continued)

(52) U.S. Cl.
CPC ........ *H01L 23/051* (2013.01); *H01L 21/4817* (2013.01); *H01L 21/4871* (2013.01);
(Continued)

(58) Field of Classification Search
CPC ............... H01L 23/051; H01L 21/4817; H01L 21/4871; H01L 23/544; H01L 23/66;
(Continued)

(56) References Cited

U.S. PATENT DOCUMENTS

| 2,515,940 A | 7/1950 | Stookey |
| 2,515,941 A | 7/1950 | Stookey |

(Continued)

FOREIGN PATENT DOCUMENTS

| CN | 1562831 A | 4/2004 |
| CN | 105047558 A | 11/2015 |

(Continued)

OTHER PUBLICATIONS

Aslan, et al, "Metal-Enhanced Fluorescence: an emerging tool in biotechnology" Current opinion in Biotechnology (2005), 16:55-62.
(Continued)

*Primary Examiner* — Duy T Nguyen
(74) *Attorney, Agent, or Firm* — Edwin S. Flores; Chalker Flores, LLP

(57) ABSTRACT

The present invention includes a method for creating a system in a package with integrated lumped element devices and active devices on a single chip/substrate for heterogeneous integration system-on-chip (HiSoC) in photo-definable glass, comprising: masking a design layout comprising one or more electrical passive and active components on or in a photosensitive glass substrate; activating the photosensitive glass substrate, heating and cooling to make the crystalline material to form a glass-crystalline substrate; etching the glass-crystalline substrate; and depositing, grow-
(Continued)

ing, or selectively etching a seed layer on a surface of the glass-crystalline substrate on the surface of the photodefinable glass.

13 Claims, 9 Drawing Sheets

(51) Int. Cl.
  *H01L 23/544* (2006.01)
  *H01L 23/66* (2006.01)

(52) U.S. Cl.
  CPC .......... *H01L 23/544* (2013.01); *H01L 23/66* (2013.01); *H01L 2223/54426* (2013.01)

(58) Field of Classification Search
  CPC . H01L 2223/54426; H01L 2223/54453; H01L 2223/6611; H01L 2223/6616; H01L 2223/6655; H01L 2223/6672; H01L 2223/6677; H01L 2223/6683; H01L 2224/11312; H01L 2224/131; H01L 2224/16235; H01L 2224/32245; H01L 2224/48456; H01L 2224/4847; H01L 2224/73253; H01L 2224/83132; H01L 2224/92242; H01L 2224/97; H01L 2924/00014; H01L 2924/13064; H01L 2924/19011; H01L 2924/19105; H01L 2924/3025; H01L 23/4824; H01L 23/498; H01L 23/492; H01L 25/16; H01L 24/48
  USPC .......................................................... 438/715
  See application file for complete search history.

(56) References Cited

U.S. PATENT DOCUMENTS

| | | | |
|---|---|---|---|
| 2,628,160 A | 2/1953 | Stookey | |
| 2,684,911 A | 7/1954 | Stookey | |
| 2,971,853 A | 2/1961 | Stookey | |
| 3,281,264 A | 10/1966 | Cape et al. | |
| 3,292,115 A | 12/1966 | La Rosa | |
| 3,904,991 A | 9/1975 | Ishli et al. | |
| 3,985,531 A | 10/1976 | Grossman | |
| 3,993,401 A | 11/1976 | Strehlow | |
| 4,029,605 A | 6/1977 | Kosiorek | |
| 4,131,516 A | 12/1978 | Bakos et al. | |
| 4,413,061 A | 11/1983 | Kumar | |
| 4,444,616 A | 4/1984 | Fujita et al. | |
| 4,514,053 A | 4/1985 | Borelli et al. | |
| 4,537,612 A | 8/1985 | Borelli et al. | |
| 4,611,882 A | 9/1986 | Susumu | |
| 4,647,940 A | 3/1987 | Traut et al. | |
| 4,692,015 A | 9/1987 | Loce et al. | |
| 4,788,165 A | 11/1988 | Fong et al. | |
| 4,942,076 A | 7/1990 | Panicker et al. | |
| 5,078,771 A | 1/1992 | Wu | |
| 5,147,740 A | 9/1992 | Robinson | |
| 5,212,120 A | 5/1993 | Araujo et al. | |
| 5,215,610 A | 6/1993 | Dipaolo et al. | |
| 5,352,996 A | 10/1994 | Kawaguchi | |
| 5,371,466 A | 12/1994 | Arakawa et al. | |
| 5,374,291 A | 12/1994 | Yabe et al. | |
| 5,395,498 A | 3/1995 | Gombinsky et al. | |
| 5,409,741 A | 4/1995 | Laude | |
| 5,733,370 A | 3/1998 | Chen et al. | |
| 5,779,521 A | 7/1998 | Muroyama et al. | |
| 5,850,623 A | 12/1998 | Carman, Jr. et al. | |
| 5,902,715 A | 5/1999 | Tsukamoto et al. | |
| 5,919,607 A | 7/1999 | Lawandy et al. | |
| 5,998,224 A | 12/1999 | Rohr et al. | |
| 6,066,448 A | 5/2000 | Wohlstadter et al. | |
| 6,094,336 A | 7/2000 | Weekamp | |
| 6,136,210 A | 10/2000 | Biegelsen et al. | |
| 6,171,886 B1 | 1/2001 | Ghosh | |
| 6,258,497 B1 | 7/2001 | Kropp et al. | |
| 6,287,965 B1 | 9/2001 | Kang et al. | |
| 6,329,702 B1 | 12/2001 | Gresham et al. | |
| 6,373,369 B2 | 4/2002 | Huang et al. | |
| 6,383,566 B1 | 5/2002 | Zagdoun | |
| 6,485,690 B1 | 11/2002 | Pfost et al. | |
| 6,495,411 B1 | 12/2002 | Mei | |
| 6,511,793 B1 | 1/2003 | Cho et al. | |
| 6,514,375 B2 | 2/2003 | Kijima | |
| 6,562,523 B1 | 2/2003 | Wu et al. | |
| 6,678,453 B2 | 1/2004 | Bellman et al. | |
| 6,686,824 B1 | 2/2004 | Yamamoto et al. | |
| 6,771,860 B2 | 8/2004 | Trezza et al. | |
| 6,783,920 B2 | 8/2004 | Livingston et al. | |
| 6,824,974 B2 | 11/2004 | Pisharody et al. | |
| 6,843,902 B1 | 1/2005 | Penner et al. | |
| 6,875,544 B1 | 4/2005 | Sweatt et al. | |
| 6,932,933 B2 | 8/2005 | Halvajian et al. | |
| 6,977,722 B2 | 12/2005 | Wohlstadter et al. | |
| 7,033,821 B2 | 4/2006 | Kim et al. | |
| 7,064,045 B2 | 6/2006 | Yang | |
| 7,132,054 B1 | 11/2006 | Kravitz et al. | |
| 7,179,638 B2 | 2/2007 | Anderson | |
| 7,277,151 B2 | 10/2007 | Ryu et al. | |
| 7,306,689 B2 | 12/2007 | Okubora et al. | |
| 7,326,538 B2 | 2/2008 | Pitner et al. | |
| 7,407,768 B2 | 8/2008 | Yamazaki et al. | |
| 7,410,763 B2 | 8/2008 | Su et al. | |
| 7,439,128 B2 | 10/2008 | Divakaruni | |
| 7,470,518 B2 | 12/2008 | Chiu et al. | |
| 7,497,554 B2 | 3/2009 | Okuno | |
| 7,603,772 B2 | 10/2009 | Farnsworth et al. | |
| 7,948,342 B2 | 5/2011 | Long | |
| 8,062,753 B2 | 11/2011 | Schreder et al. | |
| 8,076,162 B2 | 12/2011 | Flemming et al. | |
| 8,096,147 B2 | 1/2012 | Flemming et al. | |
| 8,361,333 B2 | 1/2013 | Flemming et al. | |
| 8,492,315 B2 | 7/2013 | Flemming et al. | |
| 8,709,702 B2 * | 4/2014 | Flemming | C03C 4/04 430/311 |
| 9,385,083 B1 * | 7/2016 | Herrault | H01L 24/82 |
| 9,449,753 B2 | 9/2016 | Kim | |
| 9,635,757 B1 | 4/2017 | Chen et al. | |
| 9,755,305 B2 | 9/2017 | Desclos et al. | |
| 9,819,991 B1 | 11/2017 | Rajagopalan et al. | |
| 10,070,533 B2 | 9/2018 | Flemming et al. | |
| 10,201,901 B2 | 2/2019 | Flemming et al. | |
| 2001/0051584 A1 | 12/2001 | Harada et al. | |
| 2002/0015546 A1 | 2/2002 | Bhagavatula | |
| 2002/0086246 A1 | 7/2002 | Lee | |
| 2002/0100608 A1 | 8/2002 | Fushie et al. | |
| 2003/0025227 A1 | 2/2003 | Daniell | |
| 2003/0107459 A1 | 6/2003 | Takahashi et al. | |
| 2003/0124716 A1 | 7/2003 | Hess et al. | |
| 2003/0135201 A1 | 7/2003 | Gonnelli | |
| 2003/0143802 A1 | 7/2003 | Chen et al. | |
| 2003/0156819 A1 | 8/2003 | Pruss et al. | |
| 2003/0174944 A1 | 9/2003 | Dannoux | |
| 2003/0228682 A1 | 12/2003 | Lakowicz et al. | |
| 2003/0231830 A1 | 12/2003 | Hikichi | |
| 2004/0008391 A1 | 1/2004 | Bowley et al. | |
| 2004/0020690 A1 | 2/2004 | Parker et al. | |
| 2004/0155748 A1 | 8/2004 | Steingroever | |
| 2004/0171076 A1 | 9/2004 | Dejneka et al. | |
| 2004/0184705 A1 | 9/2004 | Shimada et al. | |
| 2004/0198582 A1 | 10/2004 | Borrelli et al. | |
| 2004/0227596 A1 | 11/2004 | Nguyen et al. | |
| 2005/0089901 A1 | 4/2005 | Porter et al. | |
| 2005/0105860 A1 | 5/2005 | Oono | |
| 2005/0170670 A1 | 8/2005 | King et al. | |
| 2005/0212432 A1 | 9/2005 | Neil et al. | |
| 2005/0277550 A1 | 12/2005 | Brown et al. | |
| 2006/0092079 A1 | 5/2006 | Rochemont | |
| 2006/0118965 A1 | 6/2006 | Matsui | |
| 2006/0147344 A1 | 7/2006 | Ahn et al. | |
| 2006/0158300 A1 | 7/2006 | Korony et al. | |
| 2006/0159916 A1 | 7/2006 | Dubrow et al. | |
| 2006/0171033 A1 | 8/2006 | Shreder et al. | |

(56) References Cited

U.S. PATENT DOCUMENTS

| | | |
|---|---|---|
| 2006/0177855 A1 | 8/2006 | Utermohlen et al. |
| 2006/0188907 A1 | 8/2006 | Lee et al. |
| 2006/0193214 A1 | 8/2006 | Shimano et al. |
| 2006/0283948 A1 | 12/2006 | Naito |
| 2007/0023386 A1 | 2/2007 | Kravitz et al. |
| 2007/0120263 A1 | 5/2007 | Gabric et al. |
| 2007/0121263 A1 | 5/2007 | Liu et al. |
| 2007/0155021 A1 | 7/2007 | Zhang et al. |
| 2007/0158787 A1 | 7/2007 | Chanchani |
| 2007/0248126 A1 | 10/2007 | Liu et al. |
| 2007/0267708 A1 | 11/2007 | Courcimault |
| 2007/0272829 A1 | 11/2007 | Nakagawa et al. |
| 2007/0279837 A1 | 12/2007 | Chow et al. |
| 2007/0296520 A1 | 12/2007 | Hosokawa et al. |
| 2008/0079565 A1 | 4/2008 | Koyama |
| 2008/0136572 A1 | 6/2008 | Ayasi et al. |
| 2008/0174976 A1 | 7/2008 | Satoh et al. |
| 2008/0182079 A1 | 7/2008 | Mirkin et al. |
| 2008/0223603 A1 | 9/2008 | Kim et al. |
| 2008/0226228 A1 | 9/2008 | Tamura |
| 2008/0245109 A1* | 10/2008 | Flemming ............ C03C 23/002 65/393 |
| 2008/0291442 A1 | 11/2008 | Lawandy |
| 2008/0305268 A1 | 12/2008 | Norman et al. |
| 2008/0316678 A1 | 12/2008 | Ehrenberg et al. |
| 2009/0029185 A1 | 1/2009 | Lee et al. |
| 2009/0130736 A1 | 5/2009 | Collis et al. |
| 2009/0170032 A1 | 7/2009 | Takahashi et al. |
| 2009/0182720 A1 | 7/2009 | Cain et al. |
| 2009/0243783 A1 | 10/2009 | Fouquet et al. |
| 2010/0022416 A1 | 1/2010 | Flemming et al. |
| 2010/0059265 A1 | 3/2010 | Myung-Soo |
| 2010/0237462 A1 | 9/2010 | Beker et al. |
| 2011/0003422 A1 | 1/2011 | Katragadda et al. |
| 2011/0045284 A1 | 2/2011 | Matsukawa et al. |
| 2011/0065662 A1 | 3/2011 | Rinsch et al. |
| 2011/0108525 A1* | 5/2011 | Chien ............ C30B 1/023 216/87 |
| 2011/0170273 A1 | 7/2011 | Helvajian |
| 2011/0195360 A1 | 8/2011 | Flemming et al. |
| 2011/0217657 A1 | 9/2011 | Flemming et al. |
| 2011/0284725 A1 | 11/2011 | Goldberg |
| 2011/0304999 A1* | 12/2011 | Yu ............ H01L 23/5385 29/829 |
| 2012/0080612 A1 | 4/2012 | Grego |
| 2012/0161330 A1 | 6/2012 | Hlad et al. |
| 2013/0001770 A1 | 1/2013 | Liu |
| 2013/0015467 A1 | 1/2013 | Krumbein et al. |
| 2013/0119401 A1 | 5/2013 | D'Evelyn et al. |
| 2013/0142998 A1 | 6/2013 | Flemming et al. |
| 2013/0183805 A1 | 7/2013 | Wong et al. |
| 2013/0209026 A1 | 8/2013 | Doany et al. |
| 2013/0233202 A1 | 9/2013 | Cao et al. |
| 2013/0278568 A1 | 10/2013 | Lasiter et al. |
| 2013/0308906 A1 | 11/2013 | Zheng et al. |
| 2013/0337604 A1 | 12/2013 | Ozawa et al. |
| 2014/0002906 A1 | 1/2014 | Shibuya |
| 2014/0035540 A1 | 2/2014 | Ehrenberg |
| 2014/0035892 A1 | 2/2014 | Shenoy |
| 2014/0035935 A1 | 2/2014 | Shenoy et al. |
| 2014/0070380 A1 | 3/2014 | Chiu et al. |
| 2014/0104284 A1 | 4/2014 | Shenoy et al. |
| 2014/0144681 A1 | 5/2014 | Pushparaj et al. |
| 2014/0145326 A1 | 5/2014 | Lin et al. |
| 2014/0203891 A1 | 7/2014 | Yazak |
| 2014/0247269 A1 | 9/2014 | Berdy et al. |
| 2014/0272688 A1 | 9/2014 | Dillion |
| 2014/0367695 A1 | 12/2014 | Barlow |
| 2015/0048901 A1 | 2/2015 | Rogers |
| 2015/0071593 A1 | 3/2015 | Kanke |
| 2015/0210074 A1 | 7/2015 | Chen et al. |
| 2015/0228712 A1 | 8/2015 | Yun et al. |
| 2015/0263429 A1 | 9/2015 | Vahidpour et al. |
| 2015/0277047 A1 | 10/2015 | Flemming et al. |
| 2016/0048079 A1 | 2/2016 | Lee et al. |
| 2016/0152505 A1 | 6/2016 | Fushie |
| 2016/0181211 A1 | 6/2016 | Kamgaing et al. |
| 2016/0185653 A1 | 6/2016 | Fushie |
| 2016/0254579 A1 | 9/2016 | Mills |
| 2016/0265974 A1 | 9/2016 | Erte et al. |
| 2016/0268665 A1 | 9/2016 | Sherrer et al. |
| 2016/0320568 A1 | 11/2016 | Haase |
| 2016/0380614 A1 | 12/2016 | Abbott et al. |
| 2017/0003421 A1 | 1/2017 | Flemming et al. |
| 2017/0077892 A1 | 3/2017 | Thorup |
| 2017/0094794 A1 | 3/2017 | Flemming et al. |
| 2017/0098501 A1 | 4/2017 | Flemming et al. |
| 2017/0213762 A1 | 7/2017 | Gouk |
| 2018/0315811 A1 | 11/2018 | Cho et al. |
| 2018/0323485 A1 | 11/2018 | Gnanou et al. |
| 2019/0280079 A1 | 7/2019 | Bouvier et al. |
| 2020/0060513 A1 | 2/2020 | Ito et al. |
| 2020/0235020 A1 | 7/2020 | Boek |
| 2020/0275558 A1 | 8/2020 | Fujita |

FOREIGN PATENT DOCUMENTS

| | | |
|---|---|---|
| CN | 105938928 | 9/2016 |
| CN | 210668058 U | 6/2020 |
| DE | 102004059252 A1 | 1/2006 |
| EP | 0311274 A1 | 12/1989 |
| EP | 0507719 A1 | 10/1992 |
| EP | 0685857 B1 | 12/1995 |
| EP | 0949648 A1 | 10/1999 |
| EP | 1487019 A1 | 12/2004 |
| EP | 1683571 A1 | 6/2006 |
| JP | 08179155 | 6/1905 |
| JP | 56-15587 | 12/1981 |
| JP | 10199728 | 12/1981 |
| JP | 61149905 | 7/1986 |
| JP | 61231529 A | 10/1986 |
| JP | 62202840 A | 9/1987 |
| JP | 63-128699 A | 6/1988 |
| JP | 08026767 A | 6/1988 |
| JP | H393683 A | 4/1991 |
| JP | 05139787 A | 6/1993 |
| JP | 10007435 A | 1/1998 |
| JP | 11344648 A | 12/1999 |
| JP | 2000228615 A | 8/2000 |
| JP | 2001033664 A | 2/2001 |
| JP | 2001206735 A | 7/2001 |
| JP | 2005302987 A | 10/2005 |
| JP | 2006032982 A | 2/2006 |
| JP | 2006179564 A | 6/2006 |
| JP | 2008252797 A | 10/2008 |
| JP | 2011192836 A | 9/2011 |
| JP | 2012079960 A | 4/2012 |
| JP | 2013217989 A | 10/2013 |
| JP | 2014241365 A | 12/2014 |
| JP | 2015028651 A | 2/2015 |
| JP | H08026767 A | 1/2016 |
| JP | 2021145131 A | 9/2021 |
| KR | 1020050000923 | 1/2005 |
| KR | 100941691 B1 | 2/2010 |
| KR | 101167691 B1 | 7/2012 |
| KR | 101519760 | 5/2015 |
| WO | 2007088058 A1 | 8/2007 |
| WO | 2008119080 A1 | 10/2008 |
| WO | 2008154931 A1 | 12/2008 |
| WO | 2009029733 A2 | 3/2009 |
| WO | 2009062011 A1 | 5/2009 |
| WO | 2009126649 A2 | 10/2009 |
| WO | 2010011939 A2 | 1/2010 |
| WO | 2011100445 A1 | 8/2011 |
| WO | 2011109648 A1 | 9/2011 |
| WO | 2014062226 A1 | 1/2014 |
| WO | 2014043267 A1 | 3/2014 |
| WO | WO2014/043267 * | 3/2014 |
| WO | 2014062311 A1 | 4/2014 |
| WO | 2015108648 | 7/2015 |
| WO | 2015112903 A1 | 7/2015 |
| WO | 2015171597 A1 | 11/2015 |
| WO | 2017132280 A2 | 8/2017 |
| WO | 2017147511 A1 | 8/2017 |

(56) References Cited

FOREIGN PATENT DOCUMENTS

| WO | 2017177171 A1 | 10/2017 |
|---|---|---|
| WO | 2018200804 A1 | 1/2018 |
| WO | 2019010045 A1 | 1/2019 |
| WO | 2019118761 A1 | 6/2019 |
| WO | 2019136024 A1 | 7/2019 |
| WO | 2019199470 A1 | 10/2019 |
| WO | 2019231947 A1 | 12/2019 |
| WO | 2020060824 A1 | 3/2020 |
| WO | 2020139951 A1 | 7/2020 |
| WO | 2020139955 A1 | 7/2020 |

OTHER PUBLICATIONS

Azad, I., et al., "Design and Performance Analysis of 2.45 GHz Microwave Bandpass Filter with Reduced Harmonics," International Journal of Engineering Research and Development (2013), 5(11):57-67.
Bakir, Muhannad S., et al., "Revolutionary Nanosilicon Ancillary Technologies for Ultimate-Performance Gigascale Systems," IEEE 2007 Custom Integrated Circuits Conference (CICC), 2007, pp. 421-428.
Beke, S., et al., "Fabrication of Transparent and Conductive Microdevices," Journal of Laser Micro/Nanoengineering (2012), 7(1):28-32.
Brusberg, et al. "Thin Glass Based Packaging Technologies for Optoelectronic Modules" Electronic Components and Technology Conference, May 26-29, 2009, pp. 207-212, DOI:10.1109/ECTC.2009.5074018, pp. 208-211 Figures 3, 8.
Cheng, et al. "Three-dimensional Femtosecond Laser Integration in Glasses" The Review of Laser Engineering, vol. 36, 2008, pp. 1206-1209, Section 2, Subsection 3.1.
Chowdhury, et al, "Metal-Enhanced Chemiluminescence", J Fluorescence (2006), 16:295-299.
Crawford, Gregory P., "Flexible Flat Panel Display Technology," John Wiley and Sons, NY, (2005), 9 pages.
Grine, F. et al., "High-Q Substrate Integrated Waveguide Resonator Filter With Dielectric Loading," IEEE Access vol. 5, Jul. 12, 2017, pp. 12526-12532.
Hyeon, I-J, et al., "Millimeter-Wave Substrate Integrated Waveguide Using Micromachined Tungsten-Coated Through Glass Silicon Via Structures," Micromachines, vol. 9, 172 Apr. 9, 2018, 9 pp.
International Search Report and Written Opinion for PCT/US2020/026673 dated Jun. 22, 2020, by the USPTO, 13 pp.
International Search Report and Written Opinion for PCT/US2020/28474 dated Jul. 17, 2020 by the USPTO, 7 pp.
Mohamedelhassan, A., "Fabrication of Ridge Waveguides in Lithium Niobate," Independent thesis Advanced level, KTH, School of Engineering Sciences, Physics, 2012, 68 pp.
Muharram, B., Thesis from University of Calgary Graduate Studies, "Substrate-Integrated Waveguide Based Antenna in Remote Respiratory Sensing," 2012, 97 pp.
European Search Report and Supplemental European Search Report for EP 18889385.3 dated Dec. 2, 2020, 8 pp.
International Search Report and Written Opinion for PCT/US2020/054394 dated Jan. 7, 2021, by the USPTO, 11 pp.
Dang, et al. "Integrated thermal-fluidic I/O interconnects for an on-chip microchannel heat sink," IEEE Electron Device Letters, vol. 27, No. 2, pp. 117-119, 2006.
Dietrich, T.R., et al., "Fabrication Technologies for Microsystems Utilizing Photoetchable Glass," Microelectronic Engineering 30, (1996), pp. 407-504.
Extended European Search Report 15741032.5 dated Aug. 4, 2017, 11 pp.
Extended European Search Report 15789595.4 dated Mar. 31, 2017, 7 pp.
Extended European Search Report 17744848.7 dated Oct. 30, 2019, 9 pp.
Extended European Search Report 17757365.6 dated Oct. 14, 2019, 14 pp.
Geddes, et al, "Metal-Enhanced Fluorescence" J Fluorescence, (2002), 12:121-129.
Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.
Intel Corporation, "Intel® 82566 Layout Checklist (version 1.0)", 2006.
International Search Report and Written Opinion for PCT/US2008/058783 dated Jul. 1, 2008, 15 pp.
International Search Report and Written Opinion for PCT/US2008/074699 dated Feb. 26, 2009, 11 pp.
International Search Report and Written Opinion for PCT/US2009/039807 dated Nov. 24, 2009, 13 pp.
International Search Report and Written Opinion for PCT/US2009/051711 dated Mar. 5, 2010, 15 pp.
International Search Report and Written Opinion for PCT/US2011/024369 dated Mar. 25, 2011, 13 pp.
International Search Report and Written Opinion for PCT/US2013/059305 dated Jan. 10, 2014, 6 pp.
International Search Report and Written Opinion for PCT/US2015/012758 dated Apr. 8, 2015, 11 pp.
International Search Report and Written Opinion for PCT/US2015/029222 dated Jul. 22, 2015, 9 pp.
International Search Report and Written Opinion for PCT/US2017/019483 dated May 19, 2017, 11 pp.
International Search Report and Written Opinion for PCT/US2017/026662 dated Jun. 5, 2017, 11 pp.
International Search Report and Written Opinion for PCT/US2018/029559 dated Aug. 3, 2018, 9 pp.
International Search Report and Written Opinion for PCT/US2018/039841 dated Sep. 20, 2018 by Australian Patent Office, 12 pp.
International Search Report and Written Opinion for PCT/US2018/065520 dated Mar. 20, 2019 by Australian Patent Office, 11 pp.
International Search Report and Written Opinion for PCT/US2018/068184 dated Mar. 19, 2019 by Australian Patent Office, 11 pp.
International Search Report and Written Opinion for PCT/US2019/024496 dated Jun. 20, 2019 by Australian Patent Office, 9 pp.
International Search Report and Written Opinion for PCT/US2019/34245 dated Aug. 9, 2019 by Australian Patent Office, 10 pp.
International Search Report and Written Opinion for PCT/US2019/50644 dated Dec. 4, 2019 by USPTO, 9 pp.
International Technology Roadmap for Semiconductors, 2007 Edition, "Assembly and Packaging,"9 pages.
Kamagaing, et al., "Investigation of a photodefinable glass substrate for millimeter-wave radios on package," Proceeds of the 2014 IEEE 64th Electronic Components and Technology Conference, May 27, 2014, pp. 1610-1615.
Lakowicz, et al; "Advances in Surface-Enhanced Fluorescence", J Fluorescence, (2004), 14:425-441.
Lewis, Sr., "Hawley's Condensed Chemical Dictionary." 13th ed, 1997, John Wiley and Sons. p. 231.
Lin, C.H., et al., "Fabrication of Microlens Arrays in Photosensitive Glass by Femtosecond Laser Direct Writing," Appl Phys A (2009) 97:751-757.
Livingston, F.E., et al., "Effect of Laser Parameters on the Exposure and Selective Etch Rate in Photostructurable Glass," SPIE vol. 4637 (2002); pp. 404-412.
Lyon, L.A., et al., "Raman Spectroscopy," Anal Chem (1998), 70:341R-361R.
Papapolymerou, I., et al., "Micromachined patch antennas," IEEE Transactions on Antennas and Propagation, vol. 46, No. 2, 1998, pp. 275-283.
Perro, A., et al., "Design and synthesis of Janus micro- and nanoparticles," J Mater Chem (2005), 15:3745-3760.
Quantum Leap, "Liquid Crystal Polymer (LCP) LDMOS Packages," Quantum Leap Datasheet, (2004), mlconnelly.com/QLPKG.Final_LDMOS_DataSheet.pdf, 2 pages.
Scrantom, Charles Q., "LTCC Technology—Where We Are and Where We're Going—IV," Jun. 2000, 12 pages.
TechNote #104, Bangs Laboratories, www.bangslabs.com/technotes/104.pdf, "Silica Microspheres".

(56) References Cited

OTHER PUBLICATIONS

TechNote #205, Bangs Laboratories, www.bangslabs.com/technotes/205.pdf, "Working with Microspheres".
TechNote #205, Bangs Laboratories, www.bangslabs.com/technotes/205.pdf, "Covalent Coupling".
Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.
Zhang, H., et al., "Biofunctionalized Nanoarrays of Inorganic Structures Prepared by Dip-Pen Nanolithography," Nanotechnology (2003), 14:1113-1117.
Zhang, H., et al., Synthesis of Hierarchically Porous Silica and Metal Oxide Beads Using Emulsion-Templated Polymer Scaffolds, Chem Mater (2004), 16:4245-4256.
Chou, et al., "Design and Demonstration of Micro-mirrors and Lenses for Low Loss and Low Cost Single-Mode Fiber Coupling in 3D Glass Photonic Interposers," 2016 IEEE 66th Electronic Components and Technology Conference, May 31-Jun. 3, 7 pp.
European Search Report and Supplemental European Search Report for EP 18828907 dated Mar. 25, 2020, 11 pp.
International Search Report and Written Opinion for PCT/US2019/068586 dated Mar. 12, 2020 by USPTO, 10 pp.
International Search Report and Written Opinion for PCT/US2019/068590 dated Mar. 5, 2020 by USPTO, 9 pp.
International Search Report and Written Opinion for PCT/US2019/068593 dated Mar. 16, 2020 by USPTO, 8 pp.
Topper, et al., "Development of a high density glass interposer based on wafer level packaging technologies," 2014 IEEE 64th Electronic Components and Technology Conference, May 27, 2014, pp. 1498-1503.
Extended European Search Report for EP 19906040.1 dated Feb. 4, 2022, 16 pp.
International Search Report and Written Opinion for PCT/US2021/21371 dated May 20, 2021 by the USPTO, 10 pp.
European Search Report and Supplemental European Search Report for EP 19784673.6 dated Feb. 2, 2021, 8 pp.
European Search Report and Supplemental European Search Report for EP 19811031.4 dated Feb. 26, 2021, 7 pp.
International Search Report and Written Opinion for PCT/US2021/27499 dated Jun. 16, 2021 by the USPTO, 7 pp.
Extended European Search Report for EP 20792242.8 dated May 3, 2022, 10 pp.
Kim, Dongsu, et al., "A Compact and Low-profile GaN Power Amplifier Using Interposer-based MMCI Technology," 2014 IEEE 16th Electronics Packaging Technology Conference, pp. 672-675.
Optics 101, "What is a Halogen Lamp?", Apr. 25, 2014, p. 1-2.
European Search Report and Supplemental European Search Report for EP 19861556.9 dated Jan. 18, 2022, 9 pp.
European Search Report and Supplemental European Search Report for EP 19905255.6 dated Jul. 26, 2022, 8 pp.

* cited by examiner

HETEROGENOUS INTEGRATION FOR RF, MICROWAVE AND MM WAVE SYSTEMS IN PHOTOACTIVE GLASS SUBSTRATES

CROSS-REFERENCE TO RELATED APPLICATIONS

This application is the National Stage of International Application No. PCT/US2019/068586, filed on Dec. 26, 2019 claiming the priority to U.S. Provisional Application No. 62/786,155 filed on Dec. 28, 2018, the contents of each of which are incorporated by reference herein.

STATEMENT OF FEDERALLY FUNDED RESEARCH

None.

TECHNICAL FIELD OF THE INVENTION

The present invention relates in general to the field of heterogeneous integration of RF passive and active devices on a single chip using photoactive glass substrates.

BACKGROUND OF THE INVENTION

Without limiting the scope of the invention, its background is described in connection with heterogeneous integration RF, microwave and millimeter wave passive and active devices and subsystems into a single package or device. Where the active elements are not packaged in a ceramic or plastic package and where both the RF passive and active elements are integrated directly into or on the single substrate/structure. This represents the ultimate level of integration for an RF system.

The next level of integration beyond this is RF heterogeneous integration System on a chip (HiSoC). An RF HiSoC consists of discrete passive devices (inductor, capacitors and resistors) in the form of discrete lump element, waveguide and/or transmission line device in the form of RF Filters Impedance Matching Elements, 50 Ohm Termination Elements, Integrated Ground Planes, RF Shielding Elements, EMI Shielding Elements combined with active semiconductor devices in/on ceramic/plastic/glass substrate. The technical goal of a HiSoC has traditionally met with three primary technological hurdles. These primary technical hurdles include: 1) Thermal management (spreading and removing heat generated form the active devices; 2) Protection of both active and passive devices from mobile ion contamination from each other; and 3) Material compatibility (TCE and others). There are other secondary or engineering issues such as metallization compatibility between the active and passive devices, solder ball resolution pick and place assembly. The active semiconductor devices including; Microprocessor, Memory, Amplifier, gain blocks, high-speed transistors and other semiconductor devices, subsystems or systems.

Passive and active devices can be combined to make a wide array of RF level systems and subsystems including antennas with gain, RF Circulators, RF Isolators, RF Combiners, RF Couplers, RF Splitters, Transformers, Switches, Multiplexors, Duplexers, and/or Diplexers. Heterogeneous integration is the integrating of both the RF semiconductor die (active device) and RF Filters (passive device) directly into to the RF substrate providing the industry with: the highest level of RF electrical to RF transmission efficiency; dramatic RF system level performance in enhanced power efficiency/low power consumption, enhance transmission distance, higher data rates, in the most compact cost effective form factor.

Passive devices can be made in a photosensitive glass structures have been suggested for a number of micromachining and microfabrication processes such as integrated electronic elements in conjunction with other elements systems or subsystems. Silicon microfabrication processes rely on expensive capital equipment; photolithography and reactive ion etching or ion beam milling tools that generally cost in excess of one million dollars each and require an ultra-clean, high-production silicon fabrication facility costing millions to billions more. Injection molding and embossing are less costly methods of producing a three-dimensional shapes but generate defects with in the transfer or have differences due to the stochastic curing process. Ideal inductors would have zero resistance and zero capacitance. Real world electronic devices have "parasitic" that include: resistance, inductance and capacitance. These parasitic can come from a wide number of sources such as: (1) the inter-winding capacitance from an inductor: (2) PCB interconnects; (3) Long metal redistribution line lengths; (4) Bond pads; (5) Solder balls; (6) Substrate incompatibility plus RF losses and dielectric constant/loss tangent associated with the substrate; (7) The wire bonding is often used as the inductive element for an RF SoC. Inconstancies in the wire bonding in the shape, length, or geometries leads to significant variation in the inductance, and/or (8) inconsistent in the overall assembly. The inductance for a RF filter used in a system is often provided by the inductance of the wire used in the wire bonding. Small changes in the wire in the wire bonding have a significant impact on the inductance required for the RF filter used in RF, microwave and millimeter wave circuits filter. Traditional inductors cannot be made small enough to be an effective filter. Elimination of use of wire bond as the inductor and the associated inconstancies in the affiliated inductance is critical to increase yield and performance and decreasing cost.

Closer the integration of both the substrate, active and passive devices the dramatically reduces the losses and size for RF, Microwave and millimeter electronic systems. The technologies that comprise the substrates substrate, active and passive devices and subsystems in the past have shown to be incompatible from a thermal management, mobile ion based cross contamination, thermal expansion coefficient and additional material properties.

SUMMARY OF THE INVENTION

In one embodiment, the present invention includes a method for creating a system on a chip with passive and active devices to accomplish heterogeneous integration RF, microwave and millimeter wave in or on photo-definable glass comprising the steps of: masking a design layout comprising one or more structures to form one or more electrical subsystem, device or system on or in a photosensitive glass substrate. Where the photosensitive glass substrate; exposing at least one portion of the photosensitive glass substrate to an activating energy source; heating the photosensitive glass substrate for at least ten minutes above its glass transition temperature; cooling the photosensitive glass substrate to transform at least a part of the exposed glass to a crystalline material to form a glass-crystalline substrate; etching the glass-crystalline substrate with an etchant solution to form one or more channels in the device, wherein the glass-crystalline substrate adjacent to the trenches or vias, which may optionally be converted to a ceramic phase; and depositing, growing, or selectively etching a seed layer on a surface of the glass-crystalline substrate exposed during the etching step to enable electroplating of copper to fill the trenches and deposit on the surface of the photodefinable glass, accomplish heterogeneous integration (HI) RF, microwave and millimeter wave in or on photo-definable glass when compared to an equivalent surface mounted device. The chip has an array of copper deposited or filled on a glass substrate.

In one aspect, the method further comprises forming an isolator with HiSoC. In another aspect, the method further comprises forming a circulator with HiSoC. In another aspect, the method further HiSoC forming at least one of a low pass, high pass filter, notch filter, band pass filter, transformer, circulator, coupler, and/or isolator. In another aspect, the method further comprises forming a power combiner, a power splitter RF Circuit in or on the photo-definable glass substrate. In another aspect, the method further comprises forming one or more RF Filters, RF Circulators, RF Isolators, Antenna, Impedance Matching Elements, 50 Ohm Termination Elements, Integrated Ground Planes, RF Shielding Elements, EMI Shielding Elements, RF Combiners, RF Splitters, Transformers, Switches, power splitters, power combiners, duplexers, and/or Diplexers.

In yet another embodiment, the present invention includes a method for creating a system in a package with passive and active elements to formed as a HiSoC in or on photo-definable glass comprising the steps of: masking a design layout comprising one or more structures to form one or more electrical components on or in a photosensitive glass substrate; transforming at least a part of the exposed glass to a crystalline material to form a glass-crystalline substrate; etching the glass-crystalline substrate with an etchant solution to form one or more channels in the device, wherein the glass-crystalline substrate adjacent to the trenches/vias, which may optionally be converted to a ceramic phase; and depositing, growing, or selectively etching a seed layer on a surface of the glass-crystalline substrate exposed during the etching step to enable electroplating of copper to fill the trenches and deposit on the surface of the photodefinable glass, wherein the integrated RF passive and active devices in a HiSoC greatly reduces the parasitic noise and losses by at least 25%. The HiSoC may be in or on photo-definable glass when compared to an equivalent surface mounted or MMIC device. In another aspect, the method further comprises forming a circulator in a HiSoC. In another aspect, the method further comprises forming an RF filter and active device to form a HiSoC. In another aspect, the method further comprises forming at least one of a low pass, high pass filter, notch filter, band pass filter, transformer, circulator, coupler, isolator, with an and active device to form a HiSoC. In another aspect, the method further comprises forming a HiSoC power combiner, a power splitter RF Circuit in or on the photo-definable glass substrate. In another aspect, the method further comprises forming a HiSoC RF Circuit that eliminates at least 30% of the RF parasitic signal associated with the packaging a mount elements to a substrate. In another aspect, the method further comprises forming a HiSoC Circuit that eliminates at least 35% of the RF parasitic signal associated with the packaging a mount elements to a substrate. In another aspect, the method further comprises forming one or more RF Filters, RF Circulators, RF Isolators, Antenna, Impedance Matching Elements, 50 Ohm Termination Elements, Integrated Ground Planes, RF Shielding Elements, EMI Shielding Elements, RF Combiners, RF Splitters, Transformers, Switches, power splitters, power combiners, Duplexers, and/or Diplexers to form a HiSoC.

BRIEF DESCRIPTION OF THE DRAWINGS

For a more complete understanding of the features and advantages of the present invention, reference is now made to the detailed description of the invention along with the accompanying figures and in which.

DETAILED DESCRIPTION OF THE INVENTION

Figure 1:
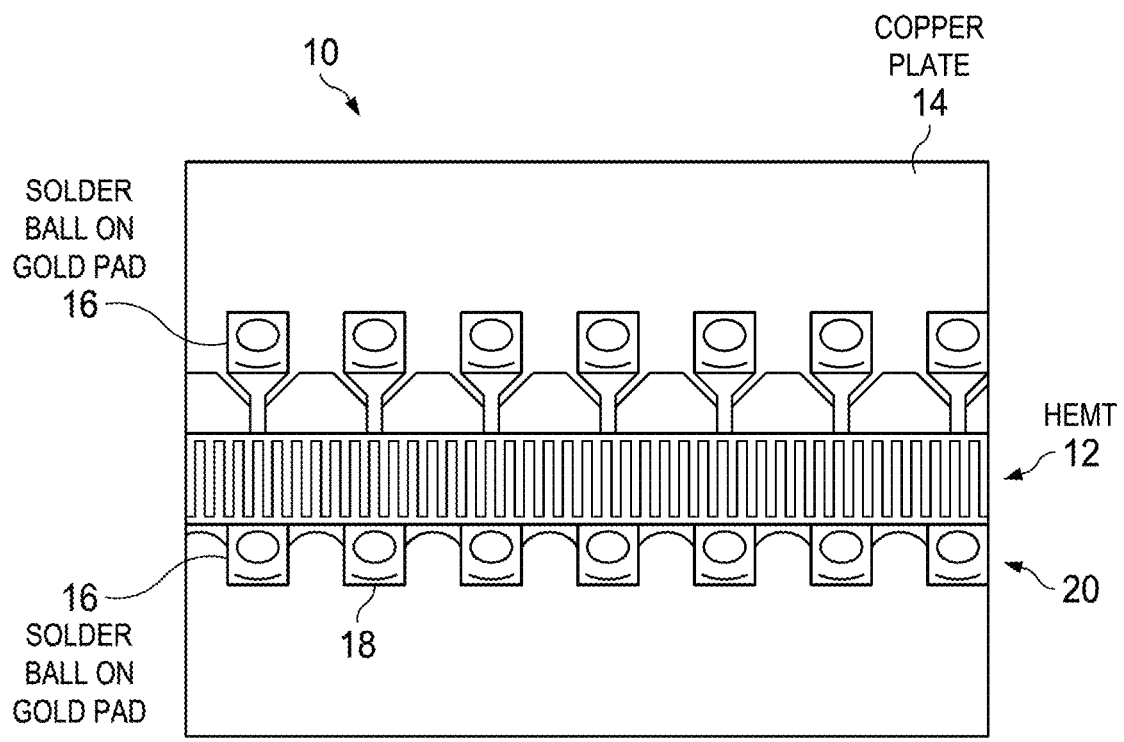
FIG. 1 is a figure of a HEMT transistor array with solder bumps on gold coated bonding pads.

While the production and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not limit the invention, except as outlined in the claims.

The present invention eliminates the parasitic losses and signals associated with lumped element devices in the RF domain. Lumped element devices or an array of lumped element devices consist of capacitors, inductors, and resistors to implement a wide number of electronic devices and functions including: filters (band-pass, band-stop, high-pass, notch, low-pass filter), circulators, antenna, power conditioning, coupler, power combiner, power splitter, matching networks, isolators and/or Doherty power amplifier in photo definable glass ceramic heterogeneous integration system on a Chip (HiSoC) maximizing packing density while eliminates or greatly reduce parasitic signals, losses while enhancing electrical efficiency. The parasitic signals or losses are generated from antennas/wire bonds effects combined with the inductance, capacitance and resistance from the packaging, solder bonding (ball grid), electronic connectors (wire), electrical bond pads and mounting elements that attach the packaged passive and active devices to form a HiSoC.

To address these needs, the present inventors developed a glass ceramic (APEX® Glass ceramic) as a novel packaging and substrate material for semiconductors, RF electronics, microwave electronics, and optical imaging. APEX® Glass ceramic is processed using first generation semiconductor equipment in a simple three step process and the final material can be fashioned into either glass, ceramic, or contain regions of both glass and ceramic. The APEX® Glass ceramic enables the creation of an HiSoC that includes one or part of the following: easily fabricated high density vias, electronic devices including; Inductors, Capacitors, Resistors, Transmission Lines, Coax Lines, Antenna, Microprocessor, Memory, Amplifier, Transistors, matching networks, RF Filters, RF Circulators, RF Isolators, Impedance Matching Elements, 50 Ohm Termination Elements, Integrated Ground Planes, RF Shielding Elements, EMI Shielding Elements, RF Combiners, RF Couplers, RF Splitters, Transformers, Transistors, Gain circuits, Switches, Multiplexors, Duplexers, and/or Diplexers.

The present inventors have demonstrated wafer-level processing of 65-μm diameter, 72-μm pitch non-copper filled TGV arrays on full 4" wafers. Calculations show that a 50-μm diameter/70-μm pitch TGV array (40% copper density in glass). This can be seen in FIG. 4. A major subset of the interconnect development focuses on layer-to-layer vertical interconnects used for both DC and RF connectors using wafer-to-wafer bonding using alignment fiducials. Since APEX® glass is transparent, in the visible spectra, the different layers of HiSoC can be aligned using ether etched or deposited fiducials on each layer/wafer. Wafer-to-wafer alignment tolerance have been shown to be as good as 0.25 μm from layer-to-layer/wafer-to-wafer alignment using fiducials and precision positioning tools. Wafer-to-Wafer Alignment of 0.25 μm has been reported in; "Wafer-to-Wafer Alignment for Three-Dimensional Integration by Lee et al in the Journal of Microelectromechanical Systems (Volume: 20, Issue: 4, August 2011).

Figure 2:
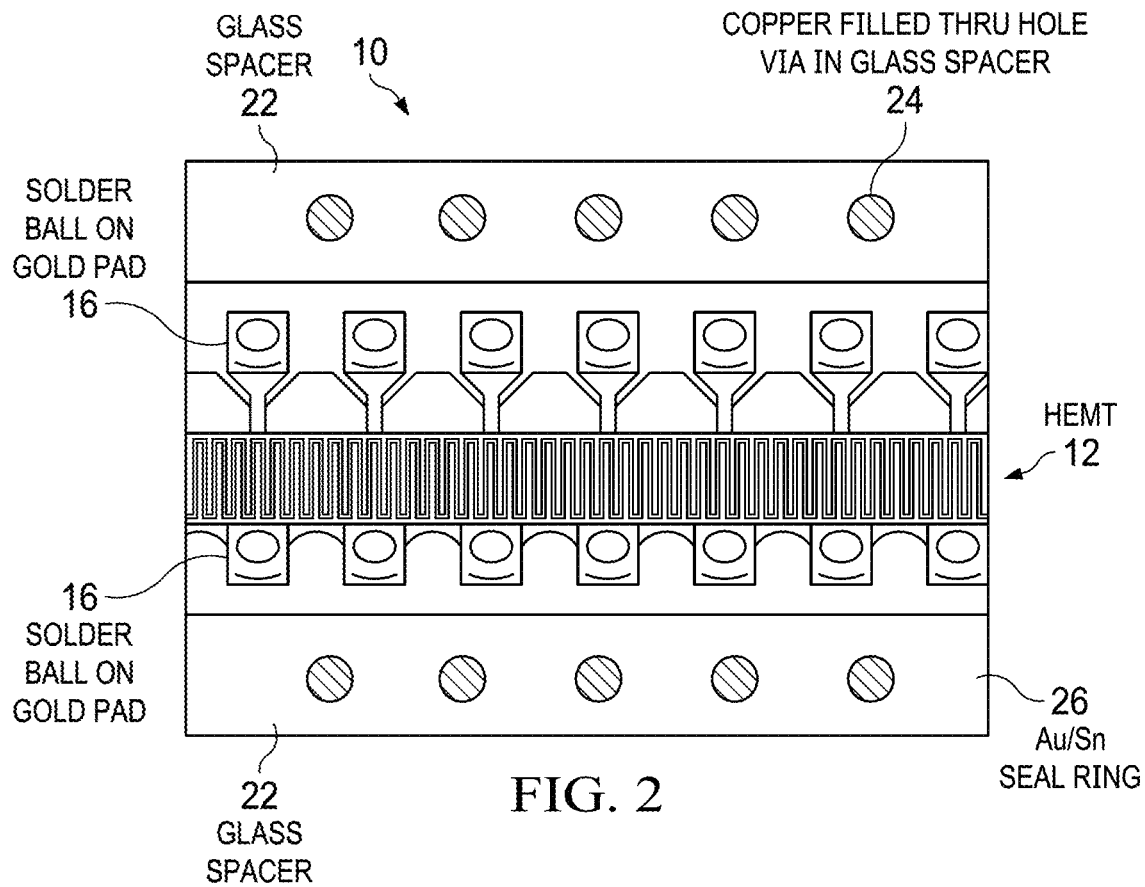
FIG. 2 is a figure of a HEMT transistor array, solder bumps on gold coated bonding pads, a glass spacers and copper filled through hole via.

A major challenge in the realization of high RF performance interconnects technology today is maintaining the appropriate characteristic impedance across the vertical layer-to-layer interface. To overcome these limitations, the present inventors explored several architectures that focus on shielded interconnects. An example of these interconnects is shown in FIG. 2. The Au/Sn metal ring acts as an adhesion layer but also can be connected to a system ground shielding the remaining electric elements and metal lines between the spacer and integrated passive device in volume of the photodefinable glass.

An HiSoC with a fully integrated lumped element device can be produced in a photo-definable glasses have high temperature stability, good mechanical and electrical properties, and have better chemical resistance than plastics and many metals. To our knowledge, the only commercial photo-definable glass is FOTURAN™, made by Schott Corporation. FOTURAN™ comprises a lithium-aluminum-silicate glass containing traces of silver ions. When exposed to UV-light within the absorption band of cerium oxide the cerium oxide acts as sensitizers, absorbing a photon and losing an electron that reduces neighboring silver oxide to form silver atoms, e.g.,

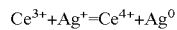

$$Ce^{3+}+Ag^+=Ce^{4+}+Ag^0$$

The silver atoms coalesce into silver nanoclusters during the baking process and induces nucleation sites for crystallization of the surrounding glass. If not processed properly or if the composition of photodefinable glass is wrong the coalesce of the silver ions can cause a uncontrolled mechanical distortion of up to 500 μm in the x/y plane of the as has been reported in FOTURAN™ photodefinable glass making layer-to-layer wafer-to-wafer alignment and assembly impossible. Only the UV light exposed regions of the glass will crystallize during subsequent heat treatment.

This heat treatment must be performed at a temperature near the glass transformation temperature (e.g., greater than 465° C. in air for FOTURAN®). The crystalline phase is more soluble in etchants, such as hydrofluoric acid (HF), than the unexposed vitreous, amorphous regions. In particular, the crystalline regions of FOTURAN® are etched about 20 times faster than the amorphous regions in 10% HF, enabling microstructures with wall slopes ratios of about 20:1 when the exposed regions are removed. See T. R. Dietrich et al., "Fabrication technologies for microsystems utilizing photoetchable glass," Microelectronic Engineering 30, 497 (1996), which is incorporated herein by reference.

Preferably, the shaped glass structure contains at least one or more, two or three-dimensional inductive device. The inductive device is formed by making a series of connected loops to form a free-standing inductor. The loops can be rectangular, circular, elliptical, fractal or other shapes that create and pattern that generates induction. The patterned regions of the APEX® glass can be filled with metal, alloys, composites, glass or other magnetic media, by a number of methods including plating or vapor phase deposition. The magnetic permittivity of the media combined with the dimensions and number of structures (loops, turns or other inductive element) in the device provide the inductance of devices.

FOTURAN® is composed of silicon oxide ($SiO_2$) of 75-85% by weight, lithium oxide ($Li_2O$) of 7-11% by weight, aluminum oxide ($Al_2O_3$) of 3-6% by weight, sodium oxide ($Na_2O$) of 1-2% by weight, 0.2-0.5% by weight antimonium trioxide ($Sb_2O_3$) or arsenic oxide ($As_2O_3$), silver oxide ($Ag_2O$) of 0.05-0.15% by weight, and cerium oxide ($CeO_2$) of 0.01-0.04% by weight. As used herein the terms "APEX® Glass ceramic", "APEX® glass" or simply "APEX®" is used to denote one embodiment of the glass ceramic composition of the present invention.

The present invention provides a single material approach for the fabrication of optical microstructures with photodefinable APEX glass for use in imaging applications by the shaped APEX glass structures that are used for lenses and includes through-layer or in-layer designs.

Generally, glass ceramics materials have had limited success in microstructure formation plagued by performance, uniformity, usability by others and availability issues. Past glass-ceramic materials have yield etch aspect-ratio of approximately 15:1 in contrast APEX® glass has an average etch aspect ratio greater than 50:1. This allows users to create smaller and deeper features. Additionally, our manufacturing process enables product yields of greater than 90% (legacy glass yields are closer to 50%). Lastly, in legacy glass ceramics, approximately only 30% of the glass is converted into the ceramic state, whereas with APEX® Glass ceramic this conversion is closer to 70%.

The APEX® Glass composition provides three main mechanisms for its enhanced performance: (1) The higher amount of silver leads to the formation of smaller ceramic crystals which are etched faster at the grain boundaries, (2) the decrease in silica content (the main constituent etched by the HF acid) decreases the undesired etching of unexposed material, and (3) the higher total weight percent of the alkali metals and boron oxide produces a much more homogeneous glass during manufacturing.

The present invention includes a method for fabricating a glass ceramic structure for use in forming inductive structures used in electromagnetic transmission, transformers and filtering applications. The present invention includes an inductive structure created in the multiple planes of a glass-ceramic substrate, such process employing the (a) exposure to excitation energy such that the exposure occurs at various angles by either altering the orientation of the substrate or of the energy source, (b) a bake step and (c) an etch step. Angle sizes can be either acute or obtuse. The curved and digital structures are difficult, if not infeasible to create in most glass, ceramic or silicon substrates. The present invention has created the capability to create such structures in both the vertical as well as horizontal plane for glass-ceramic substrates. The present invention includes a method for fabricating of an inductive structure on or in a glass ceramic.

Ceramicization of the glass is accomplished by exposing the entire glass substrate to approximately 20 J/cm$^2$ of 310 nm light. When trying to create glass spaces within the ceramic, users expose all of the material, except where the glass is to remain glass. In one embodiment, the present invention provides a quartz/chrome mask containing a variety of concentric circles with different diameters.

The present invention includes a method for fabricating an inductive device in or on glass ceramic structure electrical microwave and radio frequency applications. The glass ceramic substrate may be a photosensitive glass substrate having a wide number of compositional variations including but not limited to: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of $B_2O_3$; and $Al_2O_3$ not exceeding 13 weight %; 8-15 weight % $Li_2O$; and 0.001-0.1 weight % $CeO_2$. This and other varied composition are generally referred to as the APEX® glass.

The exposed portion may be transformed into a crystalline material by heating the glass substrate to a temperature near the glass transformation temperature. When etching the glass substrate in an etchant such as hydrofluoric acid, the anisotropic-etch ratio of the exposed portion to the unexposed portion is at least 30:1 when the glass is exposed to a broad spectrum mid-ultraviolet (about 308-312 nm) flood lamp to provide a shaped glass structure that have an aspect ratio of at least 30:1, and to create an inductive structure. The mask for the exposure can be of a halftone mask that provides a continuous grey scale to the exposure to form a curved structure for the creation an inductive structure/device. A halftone mask or grey scale enables the control the device structure by controlling the exposure intensity undercut of a digital mask can also be used with the flood exposure can be used to produce for the creation an inductive structure/device. The exposed glass is then typically baked in a two-step process. Temperature range heated between of 420° C.-520° C. for between 10 minutes to 2 hours, for the coalescing of silver ions into silver nanoparticles and temperature range heated between 520° C.-620° C. for between 10 minutes and 2 hours allowing the lithium oxide to form around the silver nanoparticles. The glass plate is then etched. The glass substrate is etched in an etchant, of HF solution, typically 5% to 10% by volume, wherein the etch ratio of exposed portion to that of the unexposed portion is at least 30:1 when exposed with a broad spectrum mid-ultraviolet flood light, and greater than 30:1 when exposed with a laser, to provide a shaped glass structure with an anisotropic-etch. The glass substrate is then etched in an etchant, of HF solution, typically 5% to 10% by volume.

Figure 3:
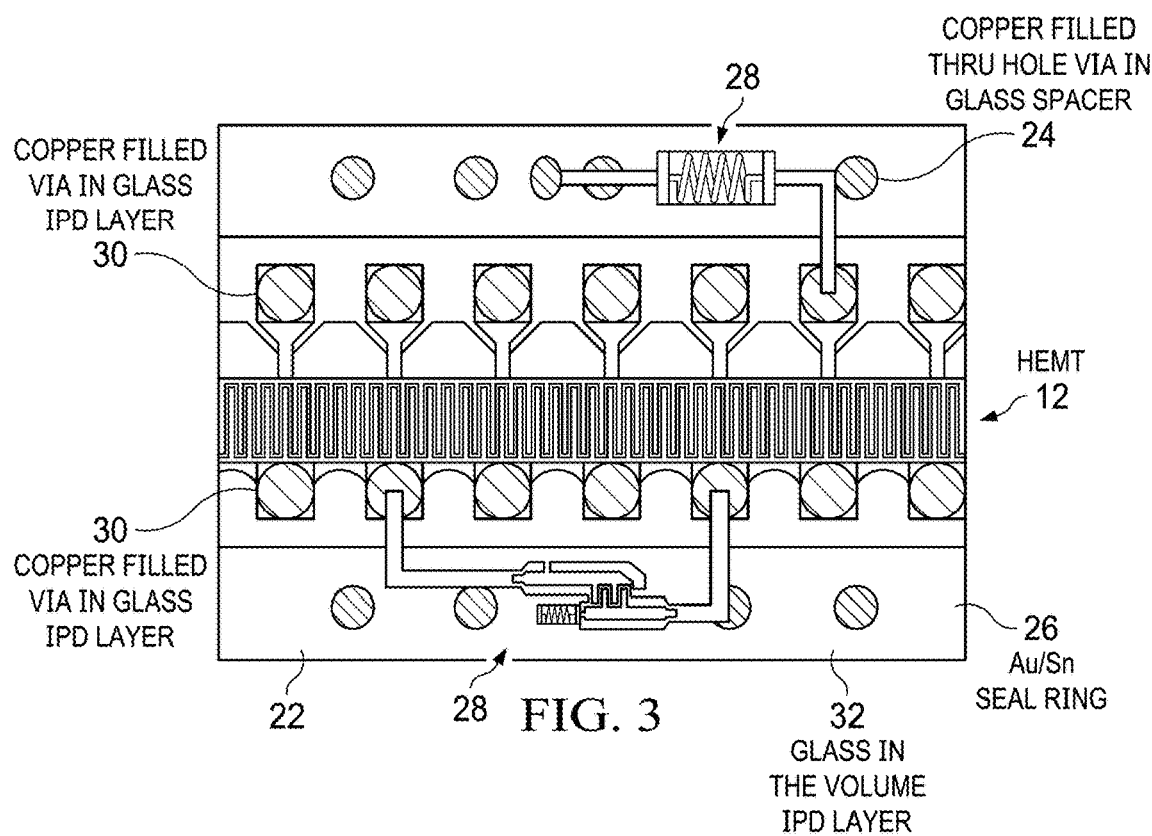
FIG. 3 is a figure of a HEMT transistor array, solder bumps on gold coated bonding pads, a glass spacers layer with copper filled through hole via and a top layer of glass with integrated passive devices creating an heterogeneous integration system on a chip.
Figure 4:
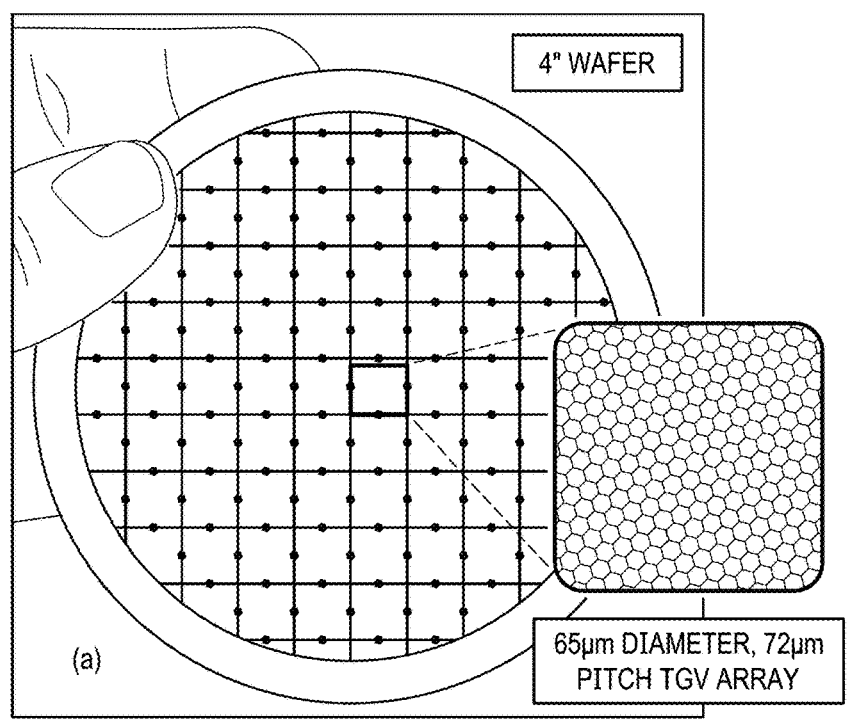
FIG. 4 is an image of a glass wafer with through hole via etched in the photodefinable glass.
Figure 5:
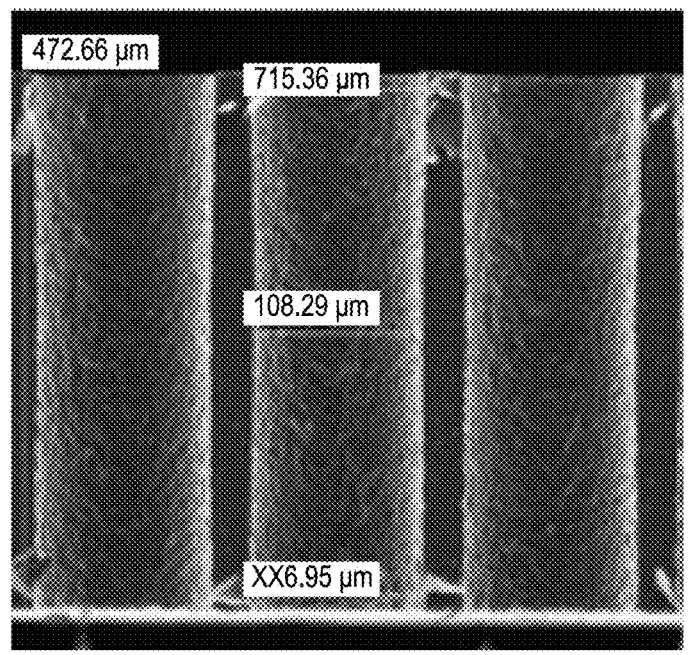
FIG. 5 is an SEM image of a cross section of copper filled glass via wafer in the photodefinable glass.
Figure 6:
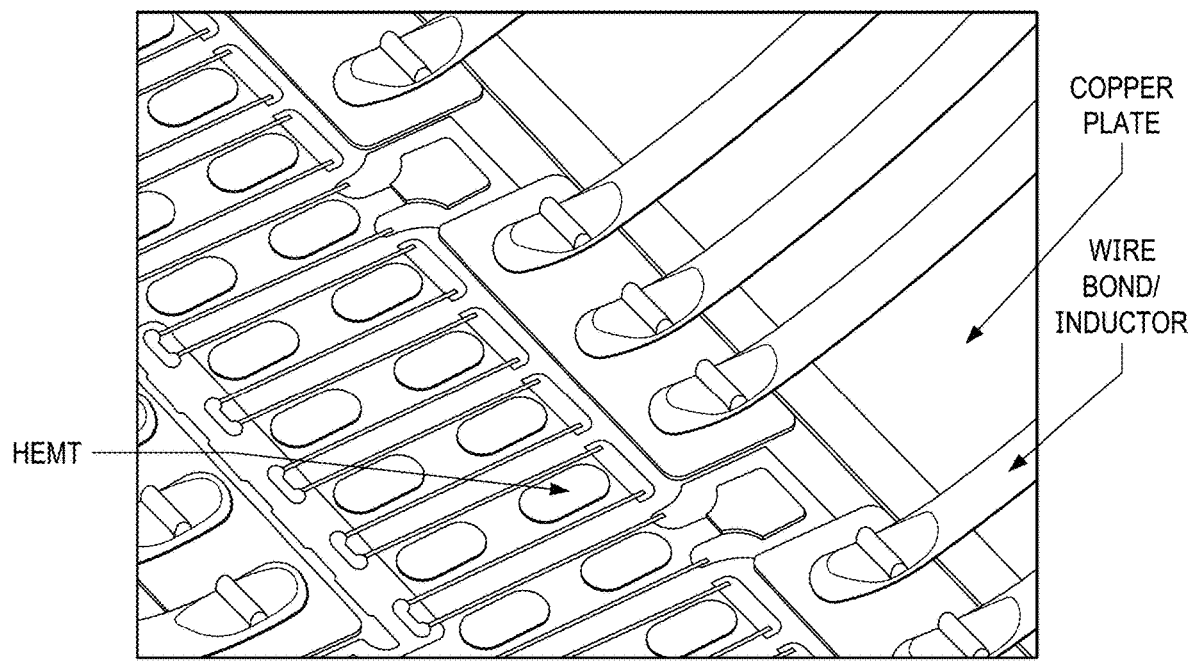
FIG. 6 is a HEMT active device on a copper substrate with wire bonds where the wire leads are used as inductors.

FIGS. 1 to 3 are top views that show making a device 10 using the present invention. FIG. 1 shows that a device 10, such as a high electron mobility transistor (HEMT) 12 or other active device is connected to a copper plate 14 using, e.g., solder balls 16 on, e.g., gold pads 18, which may connect the HEMT 12 or other device to the contact pads 20. FIG. 2 shows the addition of the spacer glass 22 that is shown having openings or vias 24 that connect to the copper plate 14. Optionally, the device 10 can also include a seal ring 26, which can be a gold/tin (Au/Sn) seal ring. FIG. 3 shows that, to connection of one or more devices 10, such as integrated lumped element devices that connect to the opening or vias 24 in the glass spacer 24 to the copper ground or plate 14 or to the HEMT 12 (or other devices 28) by the copper filled through-glass structures (via and interdigitated lines 30), a glass in the Integrated Passive Device (IPD) layer 32, e.g., an APEX glass substrate, is exposed using a second photo mask that has a pattern to connect the via for the inductors and finish the interdigitated pattern for the capacitor. The intensity is of 310 nm light is 0.1 J/cm$^2$, the wafer is the baked at 600° C. in argon for 30 min as described above. FIG. 4 is an image of a glass wafer with through hole via etched in the photodefinable glass. FIG. 5 is an SEM image of a cross section of copper filled glass via wafer in the photodefinable glass. FIG. 6 is a HEMT active device on a copper substrate with wire bonds where the wire leads are used as inductors.

Figure 7:
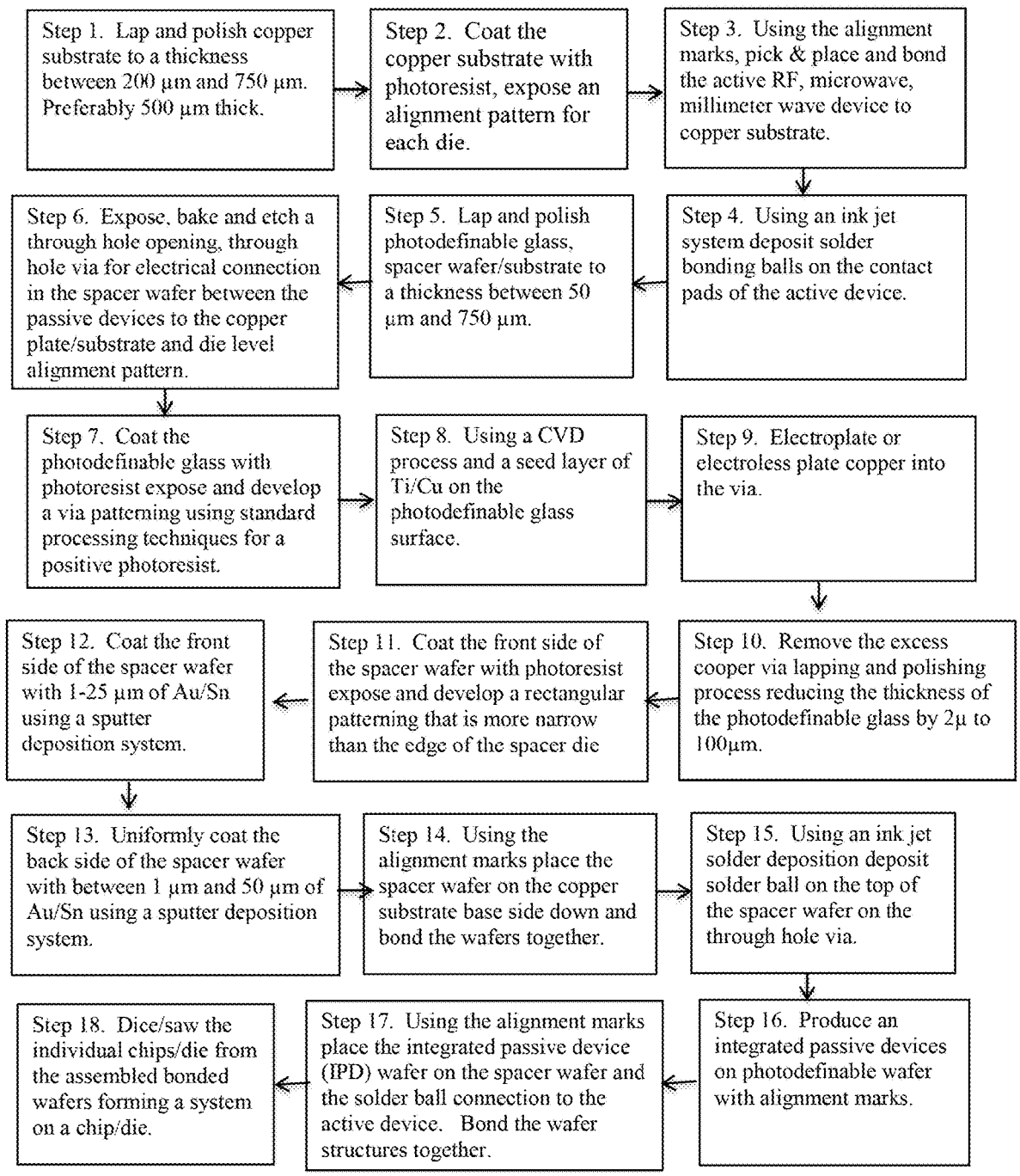
FIG. 7 is a basic flowchart of the method of the present invention.

FIG. 7 is a process flow to create the photodefinable glass based HiSoC is as follows: Step 1 is to lap and polish copper substrate to a thickness between 200 μm and 750 μm (often about 500 μm thick). Step 2 is to coat the copper substrate with photoresist, expose an alignment pattern for each die. Step 3 is to use alignment marks to pick & place and bond the active RF, microwave, millimeter wave device to copper substrate. Where the die is between 50 μm and 400 μm thick (often about 100 μm). Step 4 uses an ink jet system deposit solder bonding balls on the contact pads of the active device. Where the solder bonding balls range from 15 μm to 100 μm in diameter and preferable 35 μm diameter. Step 5 is to lap and polish photodefinable glass, spacer wafer/substrate to a thickness between 50 μm and 750 μm (often about 250 μm thick). The Q of the electronic devices becomes higher on subsequent—Volume Integrated Passive Devices (VIPD), if the thickness of the spacer wafer is greater than 70 μm. Less than 70 μm and the Q of the VIPDs are less than 60 and get worse the thinner the spacer layer. Step 6 is to expose, bake and etch a through hole opening, through hole via for electrical connection in the spacer wafer between the passive devices to the copper plate/substrate and die level alignment pattern. This structure represents a mechanical and dielectric spacer. Etch the pattern with 10% HF solution exposing the via in the photodefinable glass substrate/wafer. The exposure is accomplished at a radiation at 310 nm with an intensity ~20 J/cm2 and baked at 600° C. for at least 10 min to create the ceramic phase of the photodefinable glass. Where the composition and processing minimizes the mechanical distortion for the lithography and thermal cycling to less than 25 μm in the x/y plane of the photodefinable glass. Step 7 is to coat the photodefinable glass with photoresist expose and develop a via patterning using standard processing techniques for a positive photoresist. In Step 8, a CVD process and a seed layer of Ti/Cu are placed on the photodefinable glass surface. For example, using a photoresist stripper remove the photoresist and leave the Ti/Cu coated glass. After the photoresist has been removed anneal the Ti/Cu seed layer from 300° C. to 500° C. for 50 to 60 min in an argon or other inert gas atmosphere. Step 9 is to electroplate or electroless plate copper into the via. (see FIG. 5). Step 10 is to remove the excess cooper via lapping and polishing process reducing the thickness of the photodefinable glass by 2μ to 100 μm (often about 20 μm). Step 11 is to coat the front side of the spacer wafer with photoresist expose and develop a rectangular patterning that is from the edge of the spacer die to 15% smaller than the spacer and the thickness of the pattern is between 2 μm and 75 μm (often about 15 μm). Step 12 is to coat the front side of the spacer wafer with 1-25 μm of Au/Sn using a sputter deposition system. Then using a photoresist stripper remove the photoresist and leave Au/Sn in a continuous pattern. Where the pattern is often a rectangular pattern, but any shape pattern can be used. Where the Au/Sn pattern may coat portions of the glass surface and the copper filled via. For example, where the ring starts at the edge of the spacer and ends 15% in from the outer edge of the spacer wafer (often about 5 μm thick of Au/Sn). Step 13 is to uniformly coat the back side of the spacer wafer with between 1 μm and 50 μm of Au/Sn using a sputter deposition system (often about 5 μm thick of Au/Sn). Step 14 is to use alignment marks to place the spacer wafer on the copper substrate base side down and bond the wafers together. Step 15 is to use an ink jet solder deposition deposit solder ball on the top of the spacer wafer on the through hole via. Where the solder bonding balls range from 25 μm to 75 μm in diameter (often about 35 μm diameter). Step 16 is to produce integrated passive devices on photodefinable wafer with alignment marks. Step 17 is to use alignment marks to place the integrated passive device (IPD) wafer on the spacer wafer and the solder ball connection to the active device. Bond the wafer structures together. Finally, in Step 18, dice/saw the individual chips/die from the assembled bonded wafers forming a system on a chip/die.

In certain examples, a resistor section of HiSoC and its manufacture is shown. On a surface of the photodefinable glass wafer from Step 2, a photomask is deposited on the photodefinable glass with the pattern of a via is formed, and the photodefinable glass is exposed to a radiation at 310 nm with an intensity ~20 J/cm$^2$ and baked to create the exposure as described above. The width, length and depth of the exposure combined with the resistivity of the resistor media, which determines the resistor value. Both a top view of a cross-sectional side view are shown including a via pattern for the resistor is shown. Exposure of the photodefinable glass not covered by the mask creates a ceramic in the photodefinable glass.

The etched regions of the photodefinable glass are filled with a RF resistor paste or media of Alumina, AlN, Be or other high frequency resistor material. The trench is filed resistor paste or media is deposited via a silk-screening process. Excess paste is removed by a light DI water or IPA rinse and nylon wipe.

The photodefinable glass wafer with the resistor paste is then placed into an annealing oven with an inert environment such as Argon or a vacuum. The photodefinable glass wafer is ramped to sinter the resistive material. Any excess resistor media on the surface can be removed by a 5 min CMP process with 2 μm Silica polishing media and water.

To connect the resistor, the photodefinable glass is again coated with a standard photoresist. A pattern is exposed and developed following the standard process to create a pattern through the photoresists that a resistor layer can be deposited. The wafer is exposed to a light O$_2$ plasma to remove any residual organic material in the pattern. Typically this is accomplished at 0.1 m Torr with 200 W forward power for 1 min. Next, a metallization layer is deposited, e.g., a thin film of tantalum, titanium TiN, TiW, NiCr or other similar media. Typically, the deposition is accomplished by a vacuum deposition. The vacuum deposition of a seed layer can be accomplished by DC sputtering of tantalum through a liftoff pattern on to the glass substrate at a rate of 40 Å/min.

In another method, the photodefinable glass wafer is coated with a standard photoresist. A pattern is exposed and developed following the standard process to create a pattern through the photoresists that a metallic seed layer can be deposited. The wafer is exposed to a light O$_2$ plasma to remove any residual organic material in the pattern. Typically, this is accomplished at 0.1 mTorr with 200 W forward power for 1 min. A thin film seed layer of 400 Å of tantalum is deposited by a vacuum deposition. The vacuum deposition of a seed layer can be accomplished by DC sputtering of tantalum through a liftoff pattern on to the glass substrate at a rate of 40 Å/min.

In another embodiment, shown in FIG. 4 passive devices section of HiSoC is formed using masks. On the surface of the photodefinable glass 10 wafer from Step 1, a photomask is used to image the capacitor at 310 nm light with an intensity of ~20 J/cm2 to create a ladder shaped exposure in the photodefinable glass as described above. The spacing between the runs in the ladder can range between 5% to 95%. This structure forms an interdigitated electrode based capacitor.

In another embodiment, shown in FIG. 4, an inductor section of HiSoC is formed using masks. On a surface adjacent to the capacitor or resistor on the photodefinable glass 10 wafer as described hereinabove, a photomask with the pattern of through-hole vias is made where one of the rows of via are offset by 30% to the other row. The via pattern is exposed at 310 nm radiation at an intensity of ~20 J/cm2 to create the exposure as described above. This figures shows a top view of via pattern for the inductor.

The glass regions that have been converted to ceramic are etched in a wet etch of HF acid as described above. The photodefinable glass 10 wafer is the placed in a copper plating bath that preferentially plates the etched ceramic structure and completely fills the via and interdigitated line structure as described above.

Figure 8:
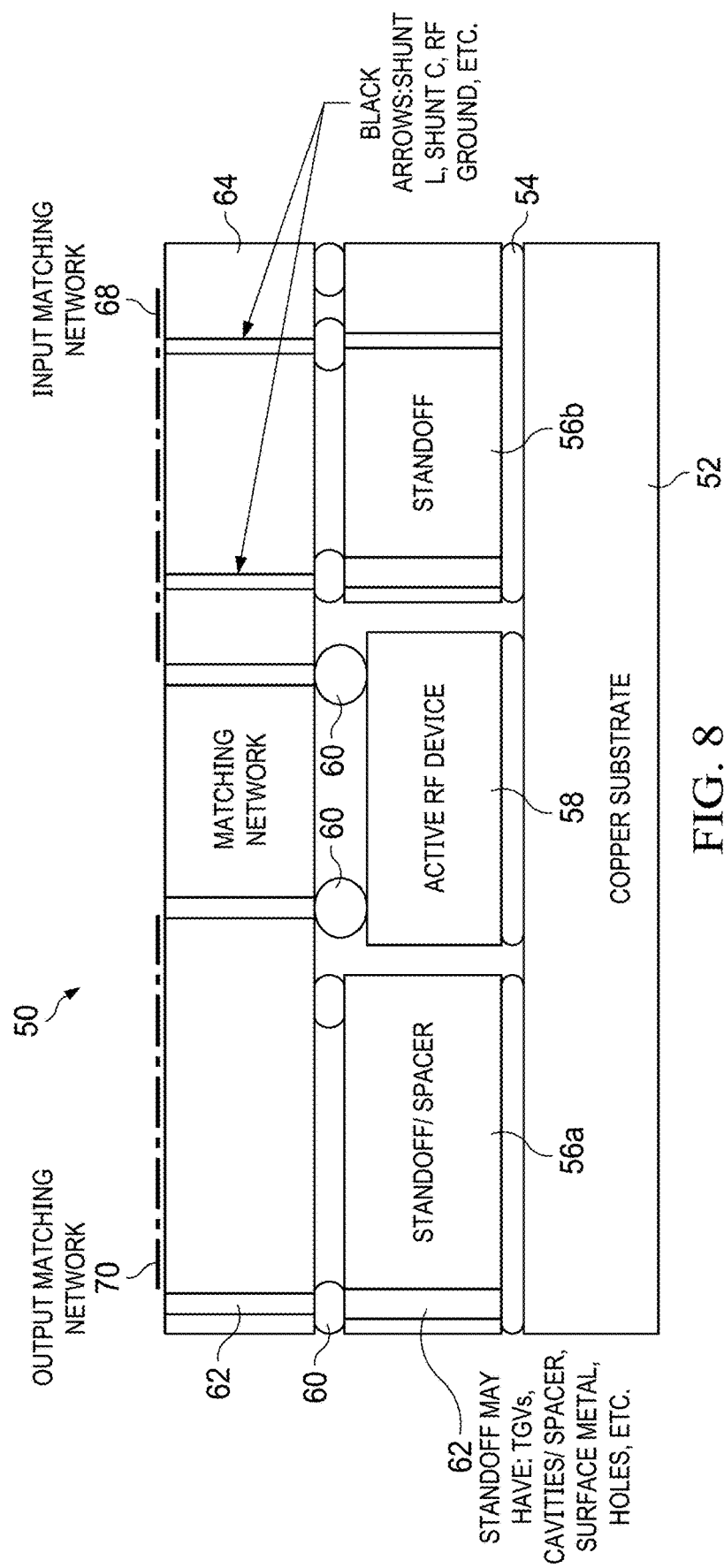
FIG. 8 is a cross-section side view of the present invention.

FIG. 8 is a cross-section side view of a configuration and use of the device 50 of the present invention. On copper substrate 52, a connection such as a solder ball or pad 54 is used to connect and/or adhere a stand-off/spacer 56*a*, 56*b*, and an active device, such as an active RF device 58. Solder balls 60 connect to vias 62 that traverse the standoff/spacers 56*a*/56*b* and that also cross a substrate 64 that can serve as a matching network and on which input matching network connections 68 are deposited or printed, as are output matching network 70 connections. In certain embodiments, the vias serve as shunts that connect to the copper substrate 52 (which can be, e.g., a shunt L, a shunt c, an RF ground, etc.).

TABLE 1

Table of compatibility elements for different substrates
used for RF, microwave and millimeter wave applications.

| Characteristic | 3D Glass | Rogers 4003 PCB [1] | DuPont LTCC [2] | Silicon |
|---|---|---|---|---|
| Flexible heterogeneous integration | ✓✓✓✓ | ✓ | ✓ | ✓ |
| Dielectric constant | 1.5-6.5 | 3.55 | 5.8 | 11.7 |
| Tanδ | 0.0008-0.008 | .0027 | .014 | .005 |
| Young's modulus (GPa) | 86 | 25 | 120 | 185 |
| CTE (ppm/K) | 10 | 11-46 | 5.8 | 3.0 |
| Thermal conductivity | 154 | 0.71 | 3.3 | 135 |
| Quick design/manufacturing | 1 week | 1 week | 4 weeks | >4 weeks |
| Fine pitch metal (microns) | >2 | >100 | >100 | >1 |
| Through vias for I/Os (microns) | >10 | >100 | >100 | >1 |
| 3D structuring w/micron precision | ✓✓✓✓ | ✓ | ✓ | ✓✓✓✓ |

Figure 9:
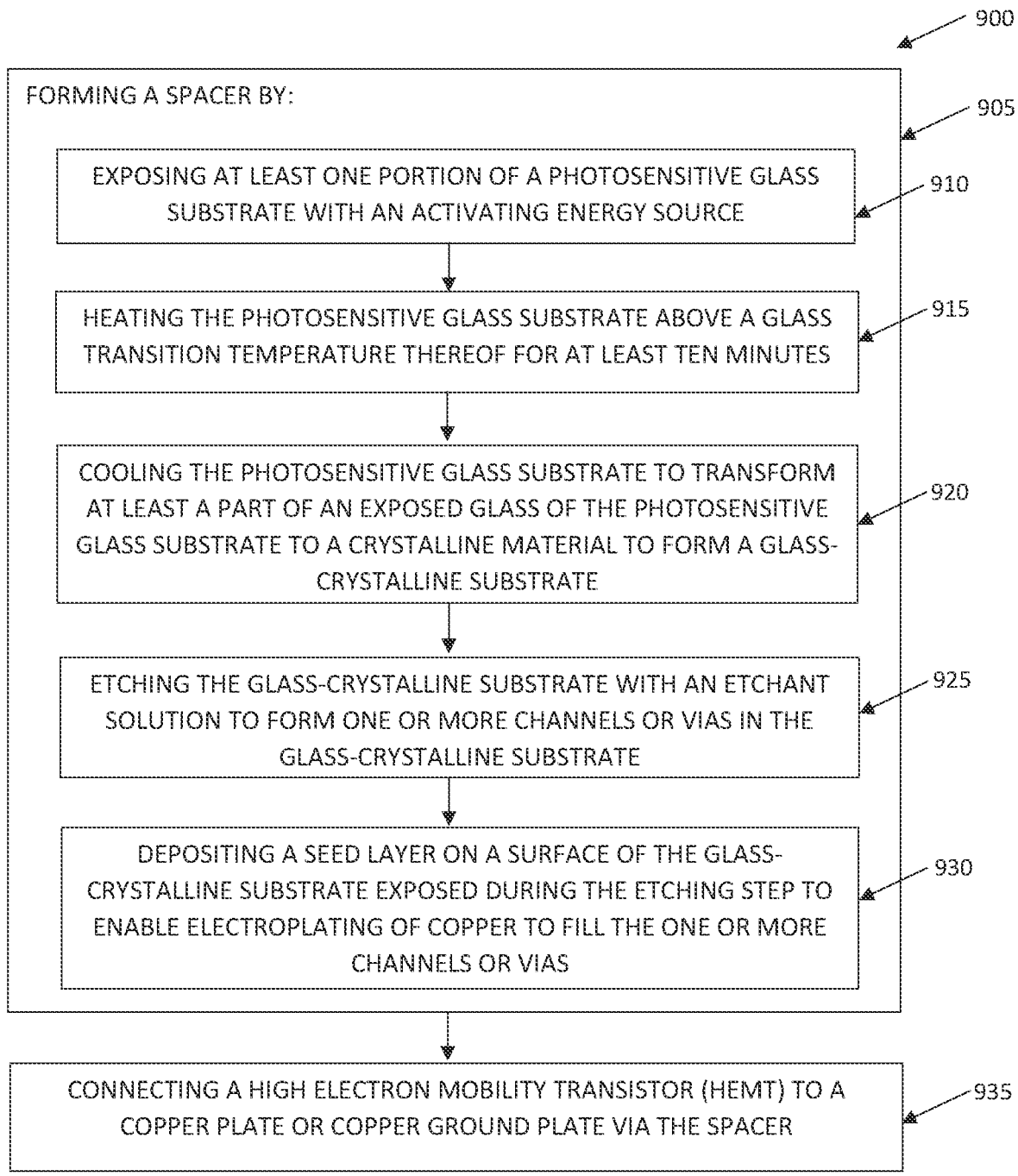
FIG. 9 shows a flowchart for a method embodiment of the invention.

FIG. 9 shows a flowchart for a method embodiment of the invention, method 900. Block 905 includes forming a spacer with the steps of blocks 910, 915, 920, 925, and 930. Block 910 includes exposing at least one portion of a photosensitive glass substrate with an activating energy source. Block 9115 includes heating the photosensitive glass substrate above a glass transition temperature thereof for at least ten minutes. Cooling the photosensitive glass substrate to transform at least part of an exposed glass of the photosensitive glass substrate to a crystalline material to form a glass-crystalline substrate is included in block 920. Block 925 includes etching the glass-crystalline substrate with an etchant solution to form one or more channel or vias in the glass-crystalline substrate. Depositing a seed layer on a surface of the glass-crystalline substrate exposed during the etching step to enable electroplating of copper to fill the one or more channels or vias is included in block 930. Block 935 includes connecting a high electron mobility transistor (HEMT) to a copper plate or copper ground plate via the spacer.

Figure 10:
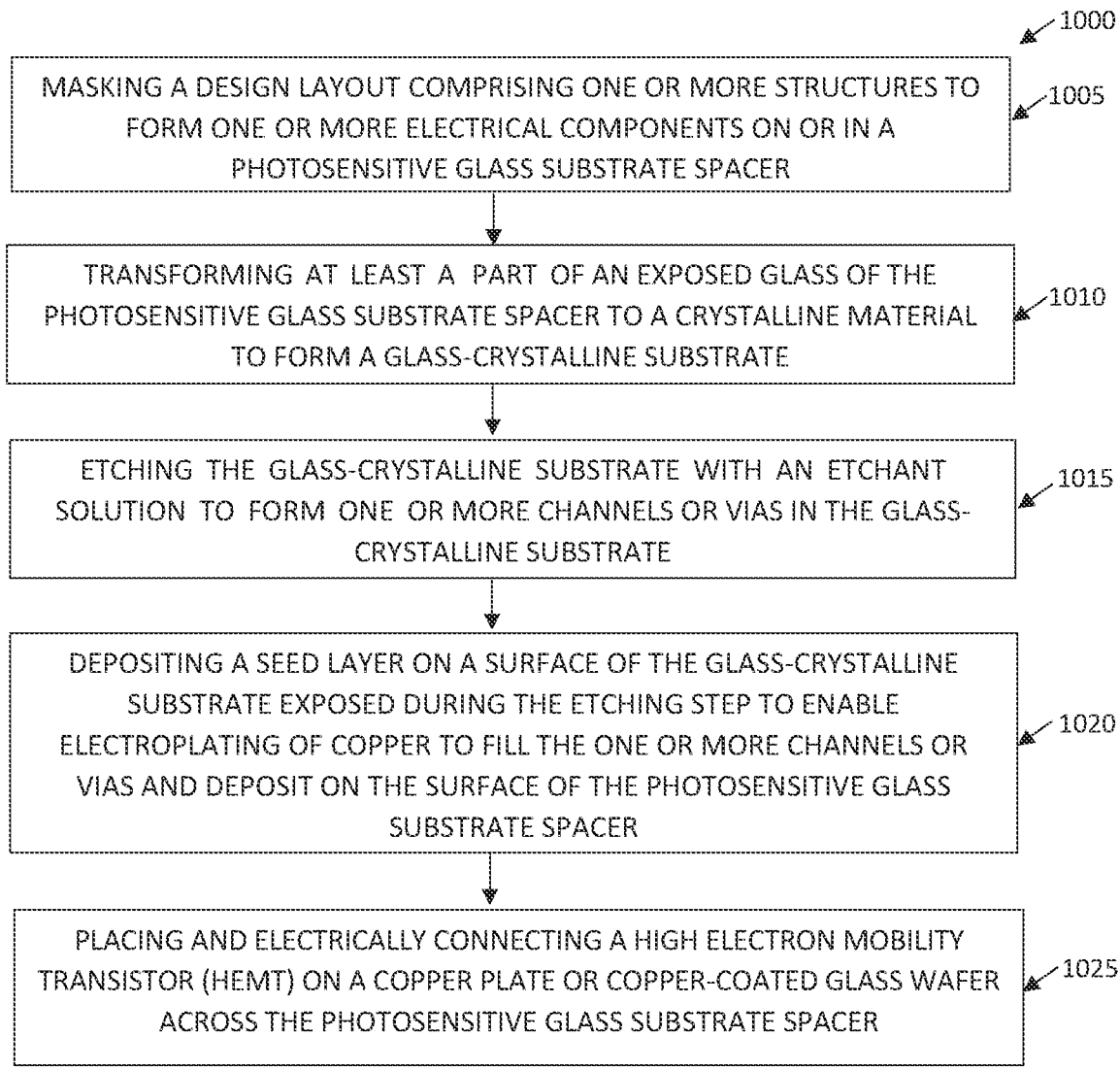
FIG. 10 shows a flowchart for another method embodiment of the invention.

FIG. 10 shows a flowchart for a method embodiment of the invention, method 1000. Block 1005 includes masking a design layout comprising one or more structures to form one or more electrical components on or in a photosensitive glass substrate spacer. Block 1010 includes transforming at least a part of an exposed glass of the photosensitive glass substrate spacer to a crystalline material to form a glass-crystalline substrate. Block 1015 includes etching the glass-crystalline substrate with an etchant solution to form one or more channels or vias in the glass-crystalline substrate. Depositing a seed layer on a surface of the glass-crystalline substrate exposed during the etching step to enable electroplating of copper to fill the one or more channels or vias and deposit on the surface of the photosensitive glass substrate spacer is included in block 1020. Block 1025 includes placing an electrically connecting a high electron mobility transistor (HEMT) on a copper plate or copper-glass wafer across the photo sensitive glass substrate spacer.

Figure 11:
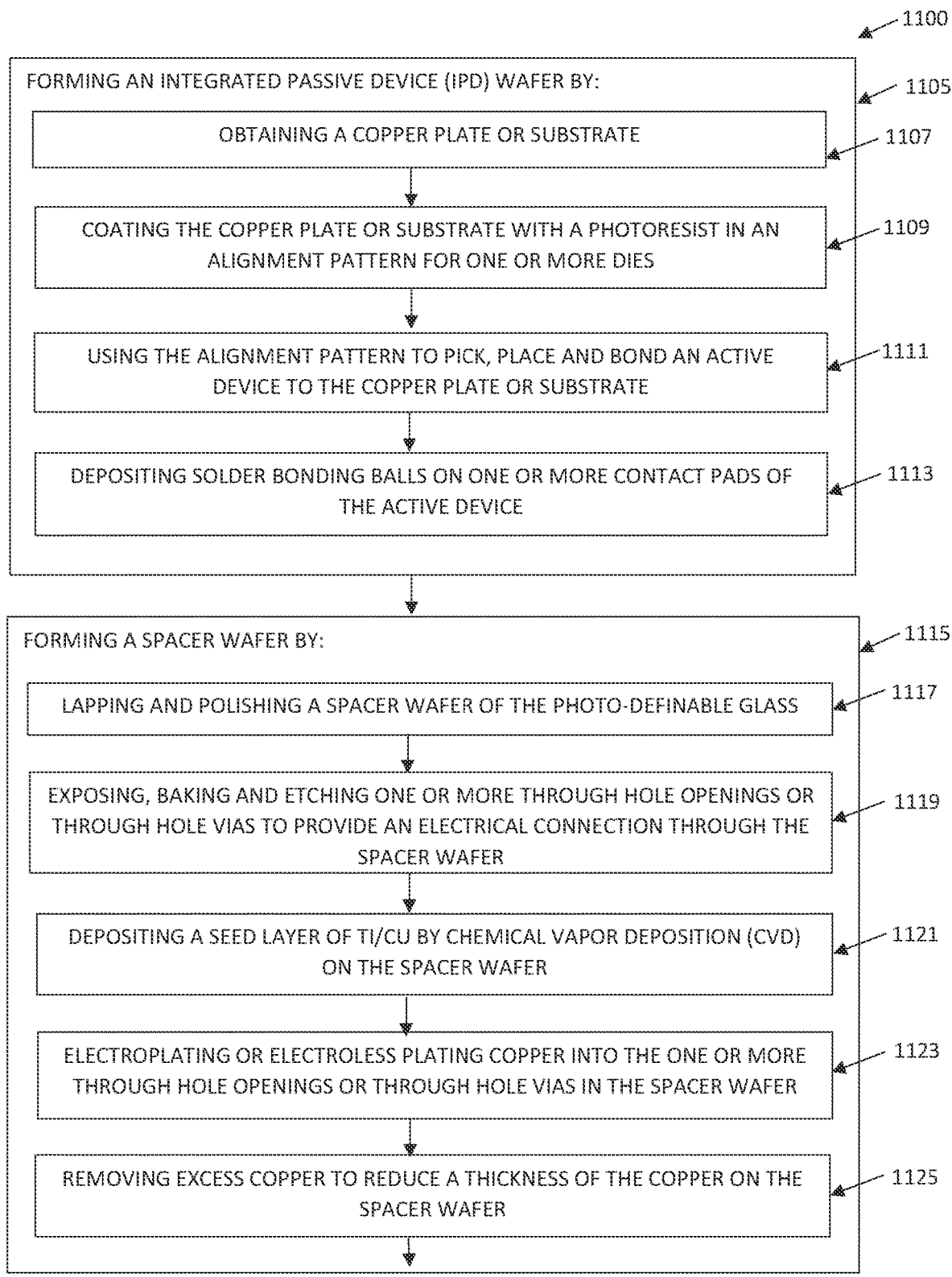
FIG. 11 shows a flowchart for another method embodiment of the invention.
Figure 11:
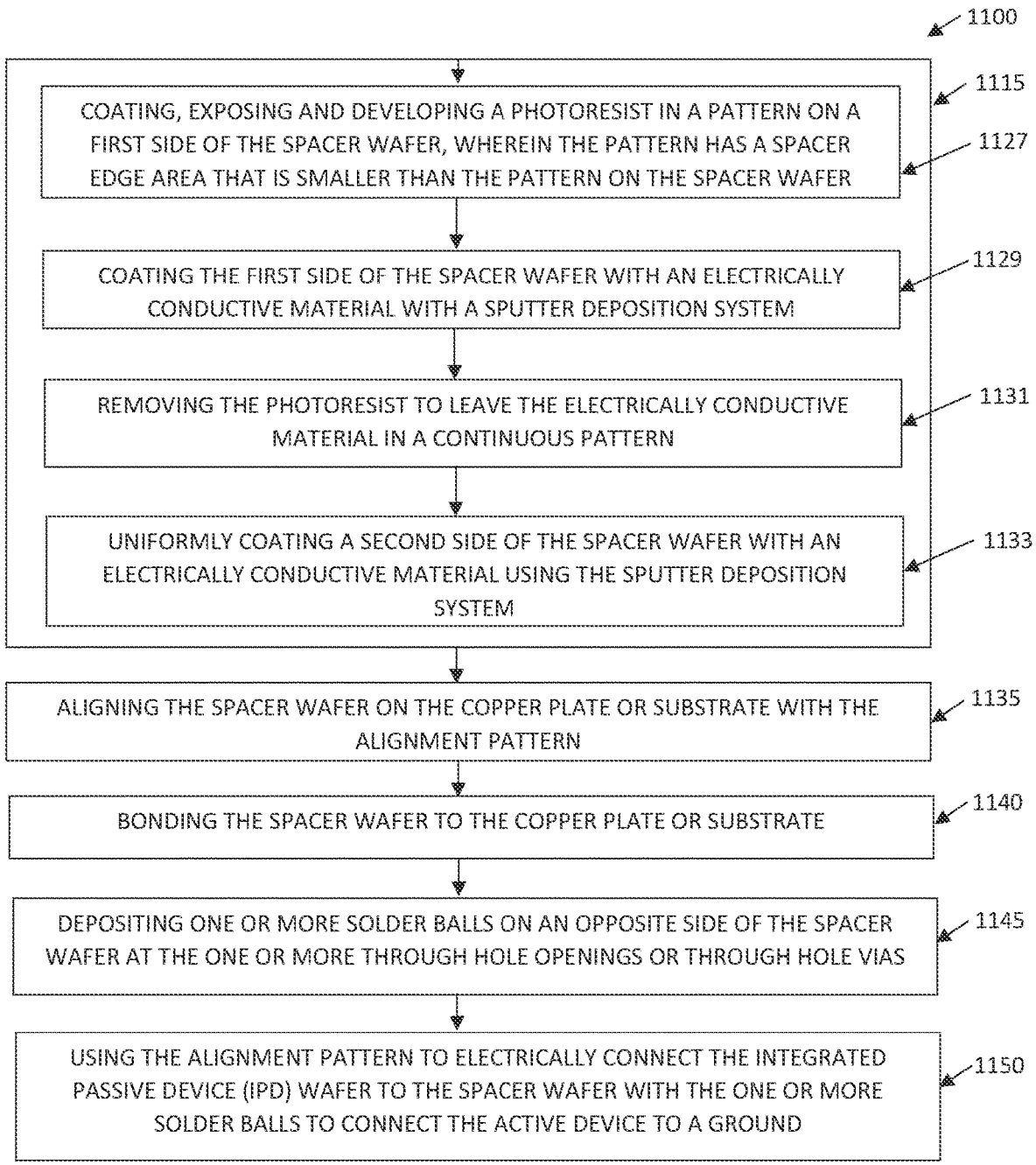

FIG. 11 shows a flowchart for a method embodiment of the invention, method 1100. Block 1105 includes forming an integrated passive device (IPD) wafer and includes blocks 1107, 1009, 1111, and 1113. Block 1107 includes obtaining a copper plate or substrate. Block 1109 includes coating the copper plate or substrate with a photoresist in an alignment pattern for one or more dies. Block 1111 includes using the alignment pattern to pick, place, and bond an active device to the copper plate or substrate. Depositing solder bond balls on one or more contact pads of the active device is included in block 1113. Block 1115 includes forming a spacer wafer and includes blocks 1117, 1119, 1121, 1123, 1125, 1127, 1129, 1131, and 1133. Block 1117 includes lapping and polishing a spacer wafer of the photo-definable glass. Block 1119 includes exposing, baking, and etching one or more through hole openings of through hole vias to provide an electrical connection through the spacer wafer. Block 1121 includes depositing a seed layer of Ti/Cu by chemical vapor deposition (CVD) on the spacer wafer. Electroplating or electroless plating copper into the one or more through hole openings or one or more vias in the spacer wafer is included in Block 1123. Block 1125 includes removing excess copper to reduce a thickness of the copper on the spacer wafer. Block 1127 includes coating, exposing, and developing a photoresist in a pattern on a first side of the spacer wafer, wherein the pattern has a spacer edge area that is smaller than the pattern on the spacer wafer. Coating the first side of the spacer wafer with an electrically conductive material with a sputter deposition system is included in block 1129. Block 1131 includes removing the photoresist to leave the electrically conductive material in a continuous pattern. Block 1133 includes uniformly coating a second side of the spacer wafer with an electrically conductive material using the sputter deposition system. Block 1135 includes aligning the spacer wafer on the copper plate or substrate with the alignment pattern. Block 1140 includes bonding the spacer wafer to the copper plate or substrate. Depositing one or more solder balls on an opposite side of the spacer wafer at the one or more through hole openings or through hole vias is included in block 1145. Block 1150 includes using the alignment pattern to electrically connect the integrated passive device (IPD) wafer to the spacer wafer with the one or more solder balls to connect the active device to a ground.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

Although the present invention and its advantages have been described in detail, it should be understood that various changes, substitutions and alterations can be made herein without departing from the spirit and scope of the invention as defined by the appended claims. In some cases, where the desired circuit performance or material compatibility the HiSoC may choose to use a SMD version of a resistor, capacitor, or inductor, in lieu of one of the photo-definable glass based devices. Using an SMD version of one or more of the elements will contribute to the parasitic generated noise of the HiSoC requiring extra care in the assembly and packaging. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), property(ies), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A method for creating a system in a package (SiP) with integrated lumped element devices formed as a heterogeneous integration system-on-chip (HiSoC) comprising the steps of:
   forming a spacer by:
   exposing at least one portion of a photosensitive glass substrate with an activating energy source;
   heating the photosensitive glass substrate above a glass transition temperature thereof for at least ten minutes;
   cooling the photosensitive glass substrate to transform at least a part of an exposed glass to a crystalline material to form a glass-crystalline substrate;
   etching the glass-crystalline substrate with an etchant solution to form one or more channels or vias in the glass-crystalline substrate;
   depositing a seed layer on a surface of the glass-crystalline substrate exposed during the etching step to enable electroplating of copper to fill the one or more channels or vias; and
   connecting a high electron mobility transistor (HEMT) to a copper plate or copper ground plate via the spacer.

2. The method of claim 1, further comprising masking the copper plate or copper ground plate to produce a design layout comprising one or more rectangular structures with a global alignment mark and a local alignment mark within the design layout.

3. The method of claim 1, further comprising at least one of: forming an isolator with the integrated lump element devices in the SiP; forming a circulator with the integrated lump element devices in the SiP; forming an RF filter with the integrated lump element devices in the SiP; forming at least one of a low pass, high pass filter, notch filter, band pass filter, transformer, circulator, coupler, isolator, with the integrated lump element devices in the SiP; forming a power combiner, a power splitter RF Circuit in or on the photosensitive glass substrate; or forming one or more RF Filters, RF Circulators, RF Isolators, Antenna, Impedance Matching Elements, 50 Ohm Termination Elements, Integrated Ground Planes, RF Shielding Elements, EMI Shielding Elements, RF Combiners, RF Splitters, Transformers, Switches, power splitters, power combiners, Duplexer, or Diplexers in or on the photosensitive glass substrate.

4. The method of claim 1, further comprising forming a SiP RF Circuit that eliminates at least 30% or 35% of an RF parasitic signal associated with mounting the package with lumped element devices to a substrate.

5. The method of claim 1, wherein the HiSoC comprises one or more layers.

6. A package lumped element device mounted to a system-in-package (SiP) in or on photo-definable glass made by a method comprising:
 forming a spacer by:
  exposing at least one portion of a photosensitive glass substrate with an activating energy source;
  heating the photosensitive glass substrate above a glass transition temperature thereof for at least ten minutes;
  cooling the photosensitive glass substrate to transform at least a part of an exposed glass of the photosensitive glass substrate to a crystalline material to form a glass-crystalline substrate;
  etching the glass-crystalline substrate with an etchant solution to form one or more channels or vias in the glass-crystalline substrate;
  depositing a seed layer on a surface of the glass-crystalline substrate exposed during the etching step to enable electroplating of copper to fill the one or more channels or vias; and
  connecting a high electron mobility transistor (HEMT) to a copper plate or copper ground plate via the spacer.

7. The device of claim 6, wherein the package lumped element device is at least one of an isolator with the integrated lumped element devices in the SiP; a circulator with the integrated lumped element devices in the SiP; an RF filter with the integrated lumped element devices in the SiP; at least one of a low pass, high pass filter, notch filter, band pass filter, transformer, circulator, coupler, isolator, with integrated lump element devices in the SiP; a power combiner, a power splitter RF Circuit in or on the photo-definable glass substrate; a SiP RF Circuit that eliminates at least 15% of an RF parasitic signal associated with the packaging a mount elements to the photosensitive glass substrate; a SiP RF Circuit that eliminates at least 25% of the RF parasitic signal associated with mounting the package lumped element device to a substrate; or one or more RF Filters, RF Circulators, RF Isolators, Antenna, Impedance Matching Elements, 50 Ohm Termination Elements, Integrated Ground Planes, RF Shielding Elements, EMI Shielding Elements, RF Combiners, RF Splitters, Transformers, Switches, power splitters, power combiners, Duplexers, or Diplexers.

8. A method for creating a system in a package with integrated lumped element devices formed as a system-in-package (SiP) in or on the photosensitive glass substrate comprising the steps of:
 masking a design layout comprising one or more structures to form one or more electrical components on or in a photosensitive glass substrate spacer;
 transforming at least a part of an exposed glass of the photosensitive glass substrate spacer to a crystalline material to form a glass-crystalline substrate;
 etching the glass-crystalline substrate with an etchant solution to form one or more channels or vias in the glass-crystalline substrate;
 depositing a seed layer on a surface of the glass-crystalline substrate exposed during the etching step to enable electroplating of copper to fill the one or more channels or vias and deposit on the surface of the photosensitive glass substrate spacer; and
 placing and electrically connecting a high electron mobility transistor (HEMT) on a copper plate or copper-coated glass wafer across the photosensitive glass substrate spacer.

9. The method of claim 8, wherein the SiP is a heterogeneous integration system-on-chip HiSoC that reduces the parasitic noise and losses at least 30, 35, 40, 45, 50, or 60% when compared to an equivalent surface mounted device.

10. The method of claim 8, further comprising forming at least one of: an isolator with the integrated lump element devices in the SiP; a circulator with the integrated lump element devices in the SiP; an RF filter with the integrated lump element devices in the SiP; at least one of a low pass, high pass filter, notch filter, band pass filter, transformer, circulator, coupler, isolator, with integrated lump element devices in a SiP; a power combiner, a power splitter RF Circuit in or on the photo-definable glass substrate.

11. The method of claim 8, further comprising forming an SiP RF Circuit that eliminates at least 25, 30 or 30% of an RF parasitic signal associated with mounting the package with integrated lumped element devices to a substrate.

12. The method of claim 8, further comprising forming one or more RF Filters, RF Circulators, RF Isolators, Antenna, Impedance Matching Elements, 50 Ohm Termination Elements, Integrated Ground Planes, RF Shielding Elements, EMI Shielding Elements, RF Combiners, RF Splitters, Transformers, Switches, power splitters, power combiners, Duplexers, and/or Diplexers.

13. A method for creating a system in a package with integrated lumped element devices formed as a heterogeneous integration system-on-chip (HiSoC) using a photo-definable glass comprising the steps of:
 forming an integrated passive device (IPD) wafer by:
 obtaining a copper plate or substrate;
 coating the copper plate or substrate with a photoresist in an alignment pattern for one or more dies;
 using the alignment pattern to pick, place and bond an active device to the copper plate or substrate;
 depositing solder bonding balls on one or more contact pads of the active device;
 forming a spacer wafer by:
 lapping and polishing a spacer wafer of the photo-definable glass;
 exposing, baking and etching one or more through hole openings or through hole vias to provide an electrical connection through the spacer wafer;
 depositing a seed layer of Ti/Cu by chemical vapor deposition (CVD) on the spacer wafer;

electroplating or electroless plating copper into the one or more through hole openings or through hole vias in the spacer wafer;
removing excess copper to reduce a thickness of the copper on the spacer wafer;
coating, exposing and developing a photoresist in a pattern on a first side of the spacer wafer, wherein the pattern has a spacer edge area that is smaller than the pattern on the spacer wafer;
coating the first side of the spacer wafer with an electrically conductive material with a sputter deposition system;
removing the photoresist to leave the electrically conductive material in a continuous pattern;
uniformly coating a second side of the spacer wafer with an electrically conductive material using the sputter deposition system;
aligning the spacer wafer on the copper plate or substrate with the alignment pattern;
bonding the spacer wafer and to the copper plate or substrate;
depositing one or more solder balls on an opposite side of the spacer wafer at the one or more through hole openings or through hole vias; and
using the alignment pattern to electrically connect the integrated passive device (IPD) wafer to the spacer wafer with the one or more solder balls to connect the active device to a ground.

\* \* \* \* \*